(12) United States Patent
Iwatsu et al.

(10) Patent No.: US 9,087,771 B2
(45) Date of Patent: Jul. 21, 2015

(54) METHOD FOR MANUFACTURING SEMICONDUCTOR DEVICE, SEMICONDUCTOR DEVICE AND JIG FOR FORMING WIRING

(71) Applicant: TOKYO ELECTRON LIMITED, Minato-ku (JP)

(72) Inventors: Haruo Iwatsu, Koshi (JP); Toshiyuki Matsumoto, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 14/176,211

(22) Filed: Feb. 10, 2014

(65) Prior Publication Data

US 2014/0151901 A1    Jun. 5, 2014

Related U.S. Application Data

(63) Continuation of application No. PCT/JP2012/069319, filed on Jul. 30, 2012.

(30) Foreign Application Priority Data

Aug. 11, 2011    (JP) .................. 2011-176386

(51) Int. Cl.
  *H01L 23/48*    (2006.01)
  *H01L 23/00*    (2006.01)
  (Continued)

(52) U.S. Cl.
  CPC ............ *H01L 24/25* (2013.01); *H01L 21/2885* (2013.01); *H01L 21/6835* (2013.01);
  (Continued)

(58) Field of Classification Search
  CPC .......... H01L 24/25; H01L 24/19; H01L 24/82

USPC .......................................... 438/107; 257/774
See application file for complete search history.

(56) References Cited

U.S. PATENT DOCUMENTS

2006/0019484 A1*   1/2006  Chen et al. .................... 438/618
2007/0120248 A1*   5/2007  Yoshimura et al. .......... 257/698
(Continued)

FOREIGN PATENT DOCUMENTS

| CN | 101878529 A | 11/2010 |
| JP | 06-291250 | 10/1994 |
| WO | WO 2011/033601 A1 | 3/2011 |

OTHER PUBLICATIONS

International Search Report mailed Oct. 30, 2012 in PCT/JP2012/069319, filed Jul. 30, 2012 (with English Translation).

(Continued)

*Primary Examiner* — Christine Enad
(74) *Attorney, Agent, or Firm* — Oblon, McClelland, Maier & Neustadt, L.L.P.

(57) ABSTRACT

A method for manufacturing a semiconductor device includes: forming a structure including a substrate, a device layer formed on the substrate, a pair of through-hole electrodes penetrating through the substrate in the thickness direction of the substrate, a pair of vertical electrodes extending in the thickness direction of the substrate and reaching to one surface of the substrate, and a shared wiring connecting the pair of vertical electrodes in the device layer; forming a connection wiring connecting one of the through-hole electrodes and one of the vertical electrodes; and stacking the structure and a second substrate such that an electrode of the second substrate is connected to a through-hole electrode which is not connected to the connection wiring among the pair of through-hole electrodes.

11 Claims, 26 Drawing Sheets

(51) Int. Cl.
　　　H01L 27/06　　(2006.01)
　　　H01L 21/768　　(2006.01)
　　　H01L 23/525　　(2006.01)
　　　H01L 23/544　　(2006.01)
　　　H01L 25/065　　(2006.01)
　　　H01L 21/683　　(2006.01)
　　　H01L 21/288　　(2006.01)
(52) U.S. Cl.
　　　CPC .... *H01L21/76838* (2013.01); *H01L 21/76892* (2013.01); *H01L 21/76898* (2013.01); *H01L 23/481* (2013.01); *H01L 23/525* (2013.01); *H01L 23/544* (2013.01); *H01L 24/19* (2013.01); *H01L 24/82* (2013.01); *H01L 25/0657* (2013.01); *H01L 27/0688* (2013.01); *H01L 2221/6834* (2013.01); *H01L 2221/68327* (2013.01); *H01L 2221/68381* (2013.01); *H01L 2223/5444* (2013.01); *H01L 2223/5448* (2013.01); *Y10T 29/532* (2015.01)

(56) References Cited

U.S. PATENT DOCUMENTS

| 2008/0220565 | A1* | 9/2008 | Hsu et al. ................ 438/109 |
| 2009/0001367 | A1* | 1/2009 | Baek et al. .............. 257/48 |
| 2013/0153269 | A1* | 6/2013 | Takahashi et al. ......... 174/254 |

OTHER PUBLICATIONS

Office Action issued Dec. 18, 2014, in Taiwanese Patent Application No. 101128140, filed Aug. 3, 2012.

* cited by examiner

METHOD FOR MANUFACTURING SEMICONDUCTOR DEVICE, SEMICONDUCTOR DEVICE AND JIG FOR FORMING WIRING

CROSS-REFERENCE TO RELATED APPLICATIONS

The present application is a continuation of PCT/JP2012/069319, filed Jul. 30, 2012, which is based upon and claims the benefit of priority to Japanese Application No. 2011-176386, filed Aug. 11, 2011. The entire contents of these applications are incorporated herein by reference.

BACKGROUND OF THE INVENTION

1. Field of the Invention

The present invention relates to a method for manufacturing a semiconductor device, to a semiconductor device manufactured by the manufacturing method, and to a jig for forming wiring.

2. Description of Background Art

In a three-dimensional integration technique of three-dimensionally stacking semiconductor chips, a so-called through-hole electrode (TSV: Through Silicon Via) is formed, for example, such that it penetrates through stacked semiconductor chips. Through such a through-hole electrode, electrical connection is established between vertically stacked semiconductor chips, and between a semiconductor chip and an electrode or the like on a substrate (see, for example, JP 06-291250 A). The entire contents of this publication are incorporated herein by reference.

SUMMARY OF THE INVENTION

According to one aspect of the present invention, a method for manufacturing a semiconductor device includes: forming a structure including a substrate, a device layer formed on the substrate, a pair of through-hole electrodes penetrating through the substrate in the thickness direction of the substrate, a pair of vertical electrodes extending in the thickness direction of the substrate and reaching to one surface of the substrate, and a shared wiring connecting the pair of vertical electrodes in the device layer; forming a connection wiring connecting one of the through-hole electrodes and one of the vertical electrodes; and stacking the structure and a second substrate such that an electrode of the second substrate is connected to a through-hole electrode which is not connected to the connection wiring among the pair of through-hole electrodes.

According to another aspect of the present invention, a semiconductor device includes: multiple substrates stacked one another and including one or more substrates including a device layer formed on the substrate, a pair of through-hole electrodes penetrating through the substrate in the thickness direction of the substrate, a pair of vertical electrodes extending through the substrate in the thickness direction of the substrate and reaching to one surface of the substrate, and a shared wiring connecting the pair of vertical electrodes in the device layer; and a connection wiring connecting one of the through-hole electrodes and one of the vertical electrodes.

According to yet another aspect of the present invention, a wiring-forming jig for forming wiring on a surface of a substrate includes a base body having a surface formed to face a substrate, and multiple opposed electrodes positioned on the surface of the base body such that the multiple opposed electrodes face multiple electrodes exposed on a surface of the substrate. The multiple opposed electrodes include one or more electrodes which switch polarity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
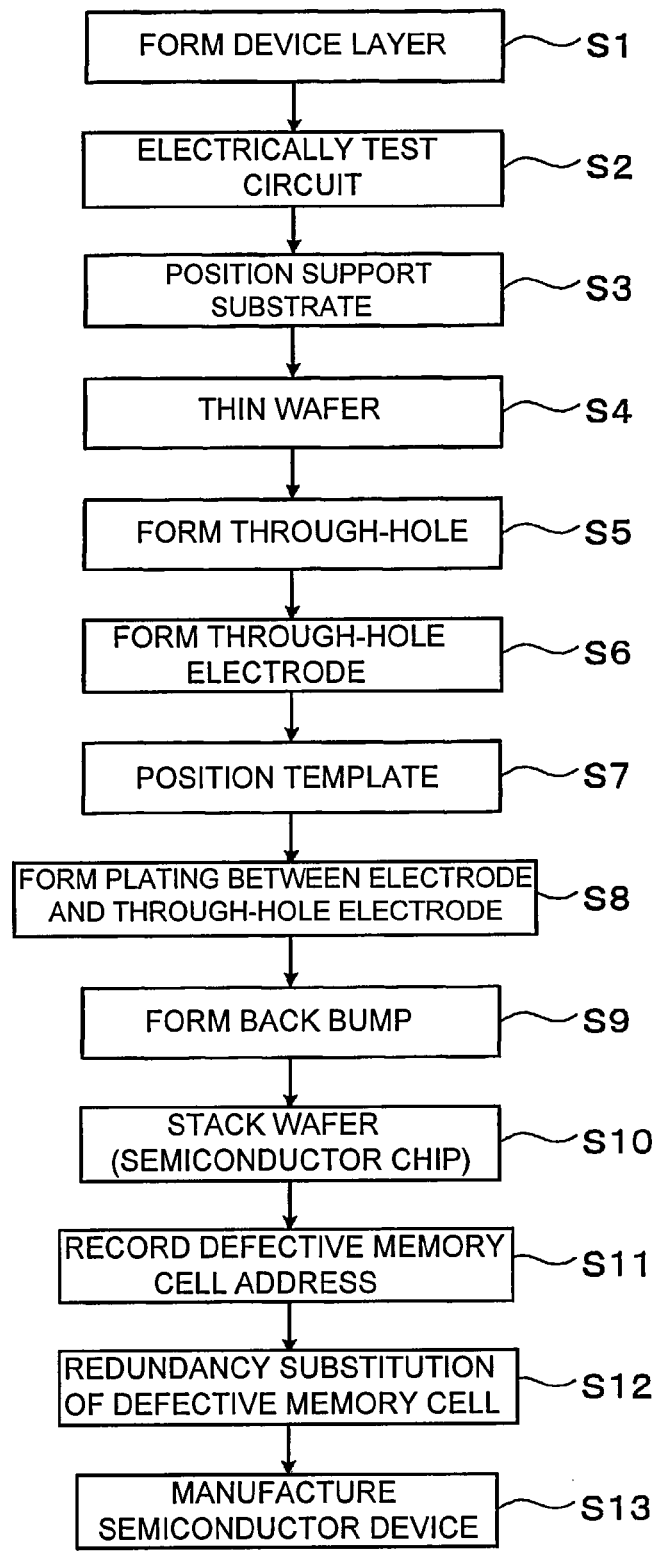
FIG. 1 is a flowchart illustrating steps of a method for manufacturing a semiconductor device according to an embodiment as a reference example.

The embodiments will now be described with reference to the accompanying drawings, wherein like reference numerals designate corresponding or identical elements throughout the various drawings.

A method for manufacturing a semiconductor device and a semiconductor device manufactured by the manufacturing method according to an embodiment of the present invention will be described. FIG. 1 illustrates a main processing flow of the method for manufacturing a semiconductor device according to the embodiment. In the drawings used for the following description, dimensions of various components do not necessarily correspond to actual dimensions, for the sake of understanding of techniques.

Figure 2:
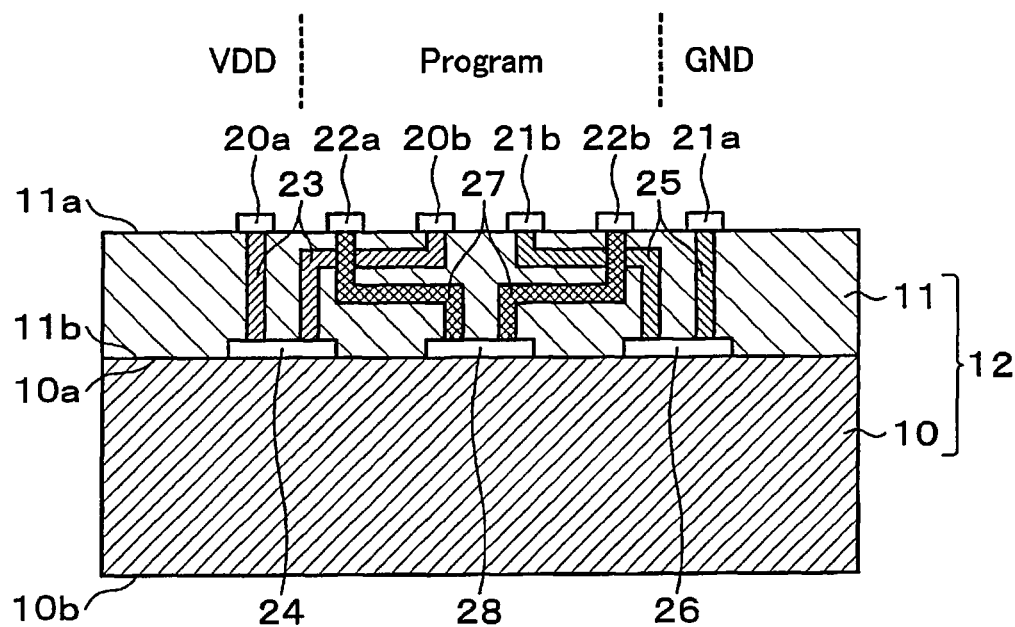
FIG. 2 is a cross-sectional view illustrating a state in which a device layer is formed on a wafer.

As illustrated in FIG. 2, a device layer 11 is formed on a wafer 10. In the following description, on the wafer 10, a surface on a device layer 11 side is referred to as a front surface (10a), and a surface opposite the device layer 11 is referred to as a back surface (10b). On the device layer 11, a surface opposite the wafer 10 is referred to as a front surface (11a), and a surface on the wafer 10 side is referred to as a back surface (11b). The wafer 10 and the device layer 11 form a semiconductor chip 12 (step (S1) in FIG. 1). Although not illustrated, multiple semiconductor chips 12 are formed on a horizontal plane with respect to one wafer 10. In the present embodiment, when wafers 10 (semiconductor chips 12) are stacked as described later, a wafer stacking method is employed so that wafers 10 prepared on a wafer level are stacked before the wafers are cut into the semiconductor chips 12.

At the front surface (11a) of the device layer 11, multiple (three, for example) pairs of front bumps (20~22) are formed as pairs of device-side bumps. A first front bump (20a) that is one of the paired first front bumps 20 extends to a portion of a power supply line serving as a first signal line, and the other first front bump (20b) extends to a portion of program wiring. That is, the first front bumps (20a, 20b) are connected to different portions. A second front bump (21a) that is one of the paired second front bumps 21 extends to a portion of a ground line serving as a second signal line, and the other second front bump (21b) extends to a portion of program wiring. That is, the second front bumps (21a, 21b) are connected to different portions. Third front bumps (22a, 22b) of the paired third front bumps 22 each extend to portions of different program wirings. The paired front bumps (20~22) can be formed by a generally used semiconductor process, and therefore do not require specific procedures.

The paired first front bumps 20 are connected through wirings 23 to a first shared wiring 24 formed on the back-surface (11b) side of the device layer 11. The paired second front bumps 21 are connected through wirings 25 to a second shared wiring 26 formed on the back-surface (11b) side of the device layer 11. The paired third front bumps 22 are connected through wirings 27 to a third shared wiring 28 formed on the back-surface (11b) side of the device layer 11. Those shared wirings (24, 26, 28) connect paired through-hole electrodes (50, 51, 52), respectively, as described later.

The device layer 11 is provided with a circuit (not illustrated) in which memory cells arranged as electronic elements, and with a redundant circuit (not illustrated) that includes a redundant memory cell which serves as a redundant electronic element to be replaced with a defective memory cell in the circuit. The wirings (23, 25, 27) are formed simultaneously in a step of forming a series of device layers 11 called BEOL (Back End of Line). Although not illustrated, the device layer 11 is provided with wiring for coupling the memory cells and others.

When the device layer 11 is formed on the wafer 10, electrical testing (step (S2) in FIG. 1) is conducted on the circuit of the device layer 11. A test for determining a state of the semiconductor chip 12 is performed to detect any defective memory cells in the circuit. The address of any detected defective memory cell is saved as data.

Figure 3:
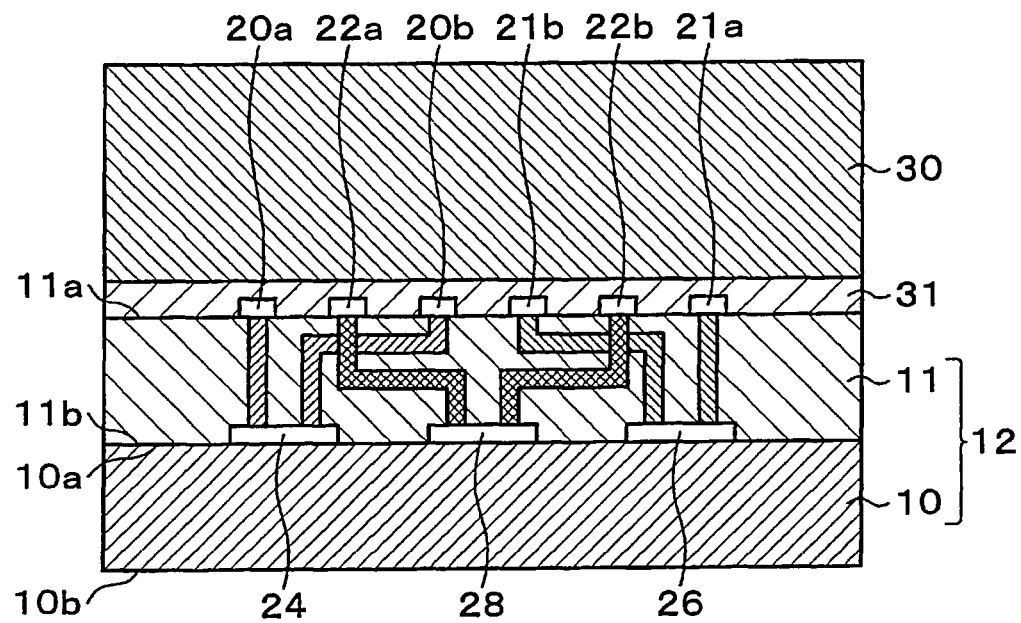
FIG. 3 is a cross-sectional view illustrating a state in which a support wafer is arranged and a wafer is thinned.

After the device layer 11 is formed on the wafer 10, a support wafer 30 serving as a support substrate is arranged on the front surface (11a) of the device layer 11 as illustrated in FIG. 3 (step (S3) in FIG. 1). The support wafer 30 is adhered to the device layer 11 by adhesive 31, for example. The support substrate is not limited to a wafer and, for example, may be a glass substrate or the like.

Figure 4:
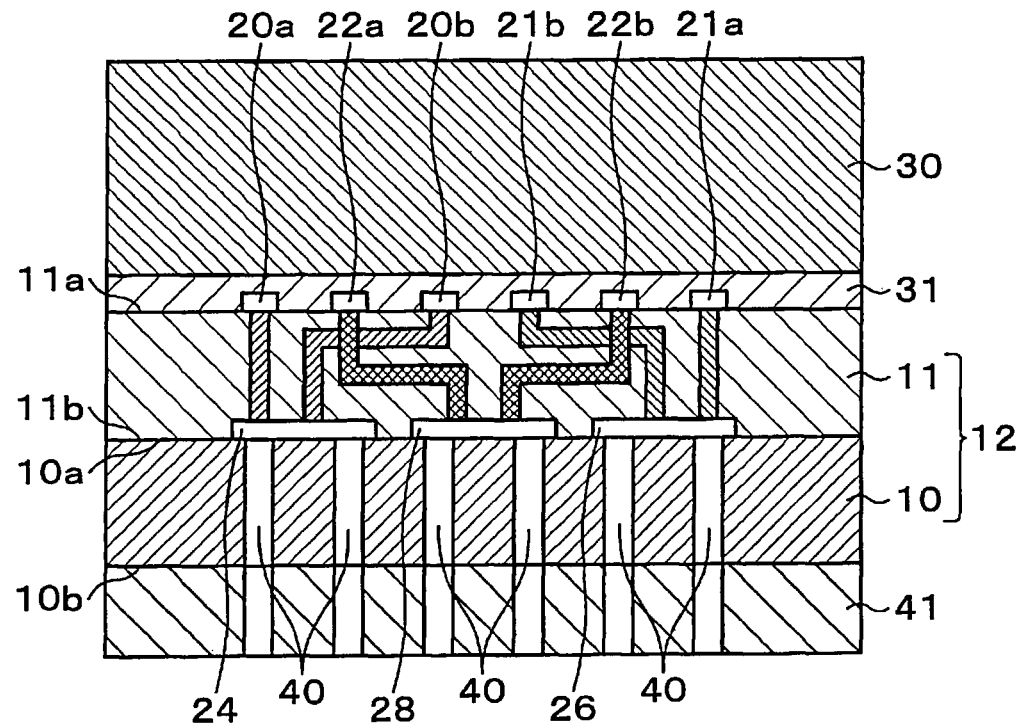
FIG. 4 is a cross-sectional view illustrating a state in which multiple through holes are formed in the wafer.

As illustrated in FIG. 4, the back surface (10b) of the wafer 10 is polished to make the wafer 10 thinner (step (S4) in FIG. 1).

As illustrated in FIG. 4, multiple through holes 40 penetrating through the wafer 10 in a thickness direction are formed (step S5 in FIG. 1). The through holes 40 are formed two each at portions corresponding to the shared wirings (24, 26, 28). Namely, the two through holes (40, 40) extend to the first, second or third shared wiring (24, 26 or 28), respectively.

The multiple through holes 40 are formed simultaneously, for example, by photolithography processing and etching processing. More specifically, after a predetermined resist pattern 41 is formed on the back surface (10b) of the wafer 10 by photolithography processing, etching is performed on the wafer 10 masked with the resist pattern 41 to form the multiple through holes 40. After forming the through holes 40, the resist pattern 41 is removed, for example, by ashing.

Figure 5:
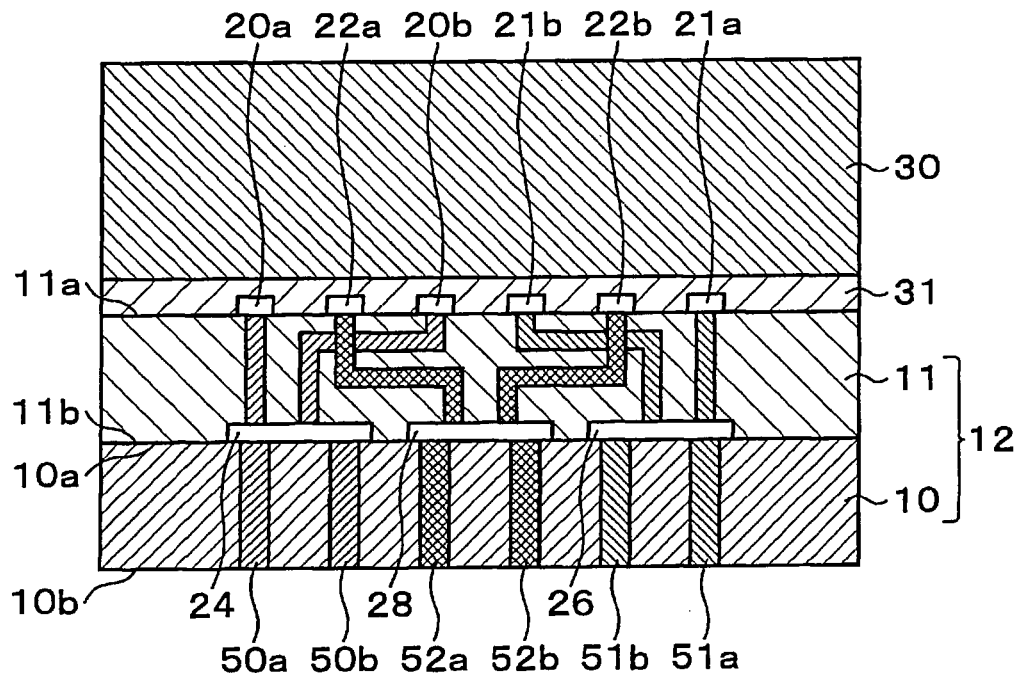
FIG. 5 is a cross-sectional view illustrating a state in which multiple pairs of through-hole electrodes are formed in the wafer.

Each through hole 40 is filled with a conductive material to form multiple (three, for example) pairs of through-hole electrodes (50, 51, 52) as illustrated in FIG. 5 (step (S6) in FIG. 1). The paired first through-hole electrodes 50 are connected each other by connecting to the first shared wiring 24. A first through-hole electrode (50a) that is one of the paired first through-hole electrodes 50 corresponds to the first front bump (20a), which extends to a portion of the power supply line, and the other first through-hole electrode (50b) corresponds to the second front bump (20b), which extends to a portion of the program wiring. The paired second through-hole electrodes 51 are connected to each other by connecting to the second shared wiring 26. A second through-hole electrode (51a) that is one of the paired second through-hole electrodes 51 corresponds to the second front bump (21a), which extends to a portion of the ground line, and the other second through-hole electrode (51b) corresponds to the second front bump (21b), which extends to a portion of the program wiring. The paired third through-hole electrodes 52 are connected to each other by connecting to the third shared wiring 28. A third through-hole electrode (52a) that is one of the paired third through-hole electrodes 52 corresponds to the third front bump (22a), which extends to a portion of the program line, and the other third through-hole electrode (52b) corresponds to the third front bump (22b), which extends to a portion of the program wiring.

Figure 6:
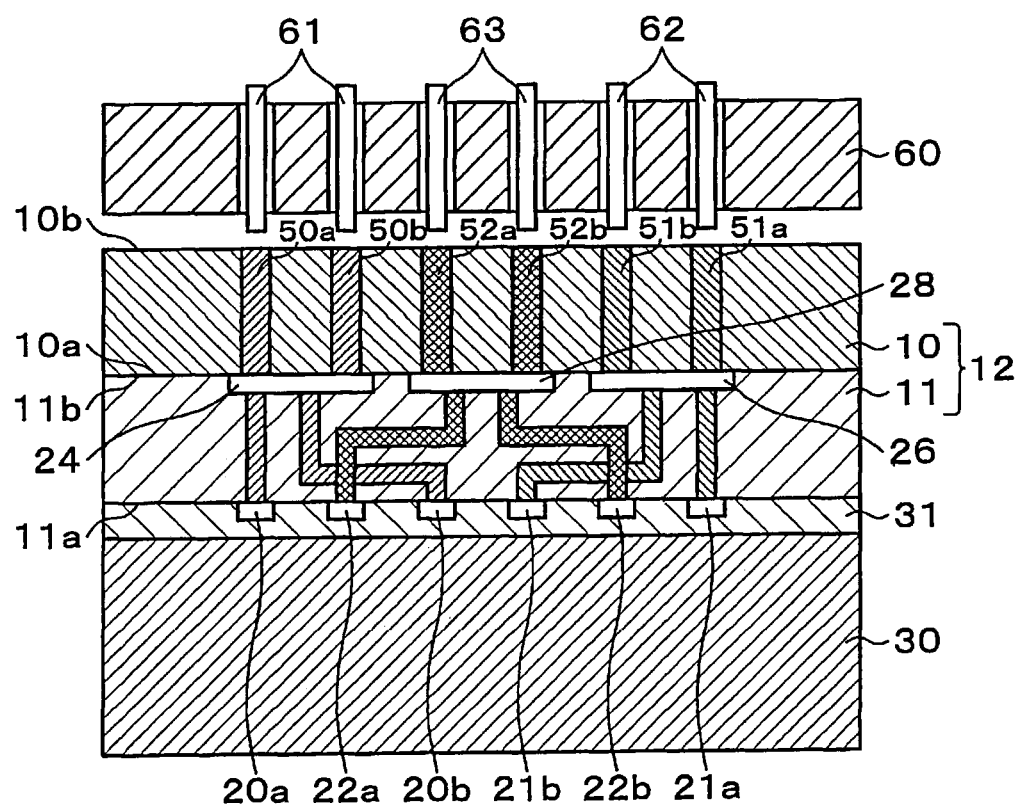
FIG. 6 is a cross-sectional view illustrating a state in which a template is arranged on a back-surface side of the wafer.

As illustrated in FIG. 6, a template 60 is disposed on the back-surface (10b) side of the wafer 10 (step S7 in FIG. 1). The template 60 is disposed at a position spaced by a distance of approximately 5 μm from the back surface (10b) of the wafer 10. The template 60 has multiple (three, for example) pairs of electrodes (61~63) whose polarities are switchable. The paired electrodes (61~63) are arranged in positions corresponding to the paired through-hole electrodes (50~52), respectively. More specifically, the paired first electrodes 61 correspond to the paired first through-hole electrodes 50, the paired second electrodes 62 correspond to the paired second through-hole electrodes 51, and the paired third electrodes 63 correspond to the paired third through-hole electrodes 52. In the example in FIG. 6, the wafer 10 and the device layer 11 are turned upside down to arrange the device layer 11 under the wafer 10.

Under such a state, the device is inspected using the through-hole electrodes exposed on the back surface (10b) of the wafer 10.

Figure 7:
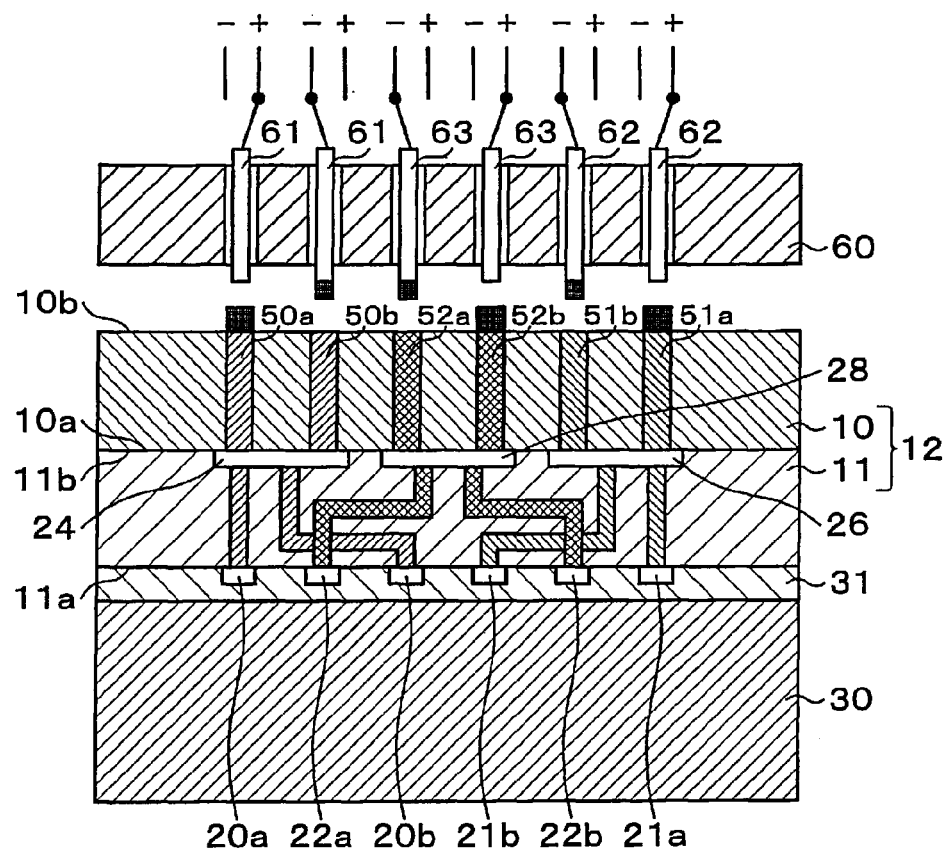
FIG. 7 is a cross-sectional view illustrating a state in which plating is formed between an electrode and a through-hole electrode.

For example, a plating solution is filled between the back surface (10b) of the wafer 10 and the template 60. Voltage is applied across the paired electrodes (61~63) by respectively assigning opposite polarities, and voltage is applied across the through-hole electrodes (50~52) by respectively assigning opposite polarities. More specifically, in the pair of, for example, first electrodes 61, one of the first electrodes 61 is connected to a positive pole, and the other first electrode 61 is connected to a negative electrode as illustrated in FIG. 7. Thereby, current flows through the paired electrodes 61, the corresponding paired first through-hole electrodes 50 and the first shared wiring 24. In the illustrated example, the first through-hole electrode (50a) becomes a negative pole, and plating is formed on the first through-hole electrode (50a). Likewise, voltage is applied across the paired second electrodes 62 by assigning opposite polarities, so that plating is formed on the second through-hole electrode (51a). Further, voltage is applied across the paired third electrodes 63 by assigning opposite polarities so that plating is formed on the third through-hole electrode (52b) (step (S8) in FIG. 1). Although plating is also formed on the negative electrodes (61~63), the plating does not grow to reach the through-hole electrodes (50~52), and will be removed after the template 60 is withdrawn from the wafer 10.

Figure 8:
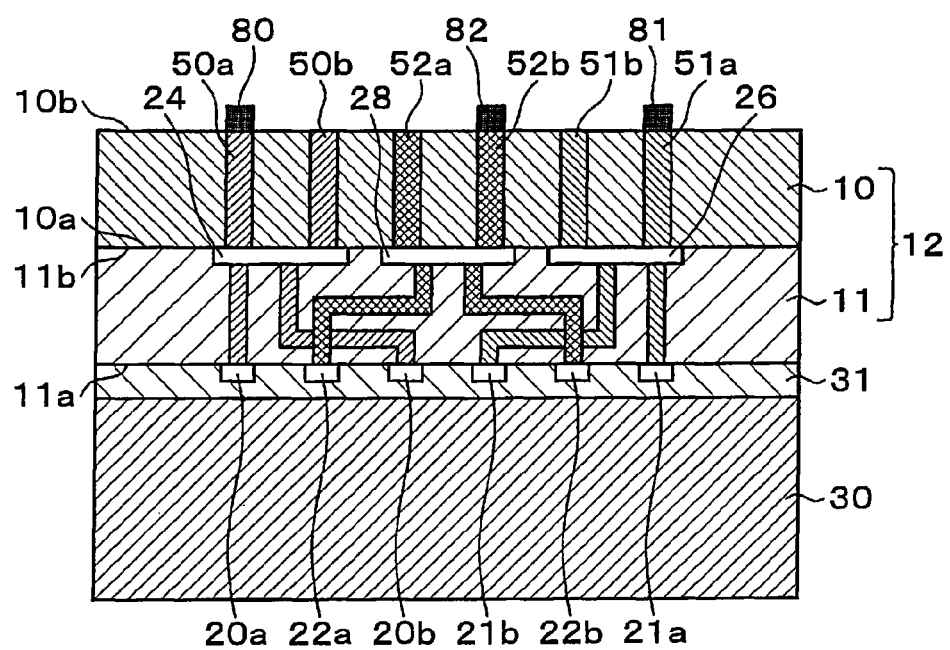
FIG. 8 is a cross-sectional view illustrating a state in which a back bump is formed on one of a pair of through-hole electrodes.

As described above, the voltage is applied to the paired first electrodes 61 by assigning opposite polarities, and a first back bump 80 serving as a substrate-side bump is formed on the first through-hole electrode (50a) which is one of the paired first through-hole electrodes 50 and is connected to the power supply line as illustrated in FIG. 8. Also, the voltage is applied to the paired second electrodes 62 by assigning opposite polarities, and a second back bump 81 is formed on the second through-hole electrode (51a), which is one of the paired second through-hole electrodes 51 and is connected to the ground line. Further, the voltage is applied to the paired third electrodes 63 by assigning opposite polarities, and a third back bump 82 is formed on the third through-hole electrode (52b), which is one of the paired third through-hole electrodes 52. That is, the back bumps (80~82) are each formed on only one of the corresponding paired through-hole electrodes (50, 51, 52) (step S9 in FIG. 1). The specific selection of the through-hole electrode (50, 51 or 52) from each pair of through-hole electrodes (50, 51, 52) for forming the back bump (80, 81 or 82) thereon is determined based on the address of a defective memory cell detected in the electrical testing of the circuit in the step (S2), as will be described later.

Figure 9:
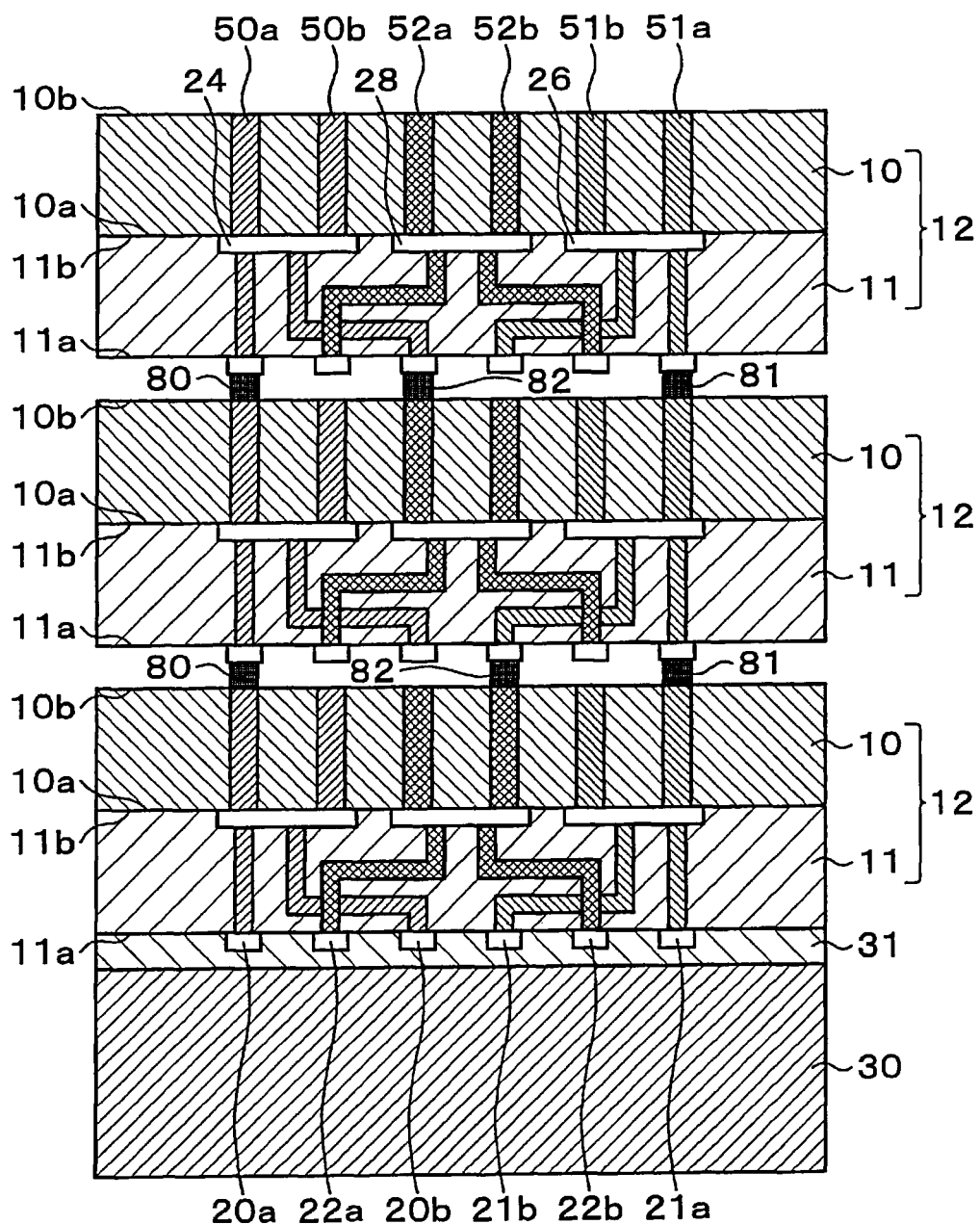
FIG. 9 is a cross-sectional view illustrating a state in which multiple wafers are stacked.

As illustrated in FIG. 9, the wafers 10 (semiconductor chips 12) each provided with the device layer 11 are stacked (step S10 in FIG. 1). The present embodiment will be described using an example where the wafers 10 are successively stacked in ascending order. In the following description, the wafer 10 (the device layer 11 and the semiconductor chip 12) in the backmost layer is referred to as the first wafer 10 (the first device layer 11 and the first semiconductor chip 12), and those in the front positions are referred to as the second and third wafers 10 (the second device layer 11 and the second semiconductor chip 12, and the third device layer 11 and the third semiconductor chip 12) in ascending order. The example in FIG. 9 is described by referring to a case where the three wafers 10 are stacked. However, the number of the stacked wafers 10 is not limited to three, and any other number may be employed.

The first wafer 10 is subjected to steps (S1)~(S9) above to form the back bumps 80~82 on the back surface (10b) of the first wafer 10. Likewise, the second wafer 10 is subjected to the steps (S1)~(S9) above to form the back bumps 80~82. After the step (S9), the second wafer 10 is processed to remove the support wafer 30 arranged on the front surface (11a) of the second device layer 11.

Then, the first and second wafers 10 are stacked so that the back surface (10b) of the first wafer 10 faces the front surface (11a) of the second device layer 11. The first back bump 80 on the first wafer 10 is connected to the first front bump (20a) of the second device layer 11, the second back bump 81 is connected to the second front bump (21a), and the third back bump 82 is connected to the second front bump (21b). Thereby, the third through-hole electrode 52 of the first wafer 10 for programming is connected to a ground line through the third back bump 82 and the second device layer 11 such as the second front bump (21b). Thereby, a program "0," for instance, is recorded by the first and second semiconductor chips 12. The back surface (10b) of the first wafer 10 and the second device layer 11 are adhered, for example, by an adhesive (not illustrated).

The back bumps (80~82) on the second wafer 10 are formed on the first, second and third through-hole electrodes (50a, 51a, 52a), respectively. After the steps (S1)~(S9) above are performed for the third wafer 10, a predetermined circuit connected to the through-hole electrodes (50~52) on the back surface (10b) of the third wafer 10 is formed on the third wafer 10. After the predetermined circuit is formed on the third wafer 10, the support wafer 30 disposed on the front surface (11a) of the third device layer 11 is removed.

Under such state, the second and third wafers 10 are stacked so that the back surface (10b) of the second wafer 10 faces the front surface (11a) of the third device layer 11. The first, second and third back bumps 80, 81 and 82 on the second wafer 10 are connected to the first, second and first front bumps (20a, 21a, 20b) of the third device layer 11, respectively. Thereby, the third through-hole electrode 52 of the first wafer 10 for programming is connected to the power supply line through the third back bump 82 and the second device layer 11 such as the first front bump (20b). Thereby, a program "1," for instance, is recorded by the second and third semiconductor chips 12. The back surface (10b) of the second wafer 10 and the third device layer 11 are adhered, for example, by an adhesive (not illustrated).

As described above, in the first to third semiconductor chips 12, each first back bump 80 is connected to the first front bump (20a), and the power supply line penetrates through each semiconductor chip 12 for connection. Also, each second back bump 81 is connected to the second front bump (21a), and the ground line penetrates through each semiconductor chip 12 for connection.

Figure 10:
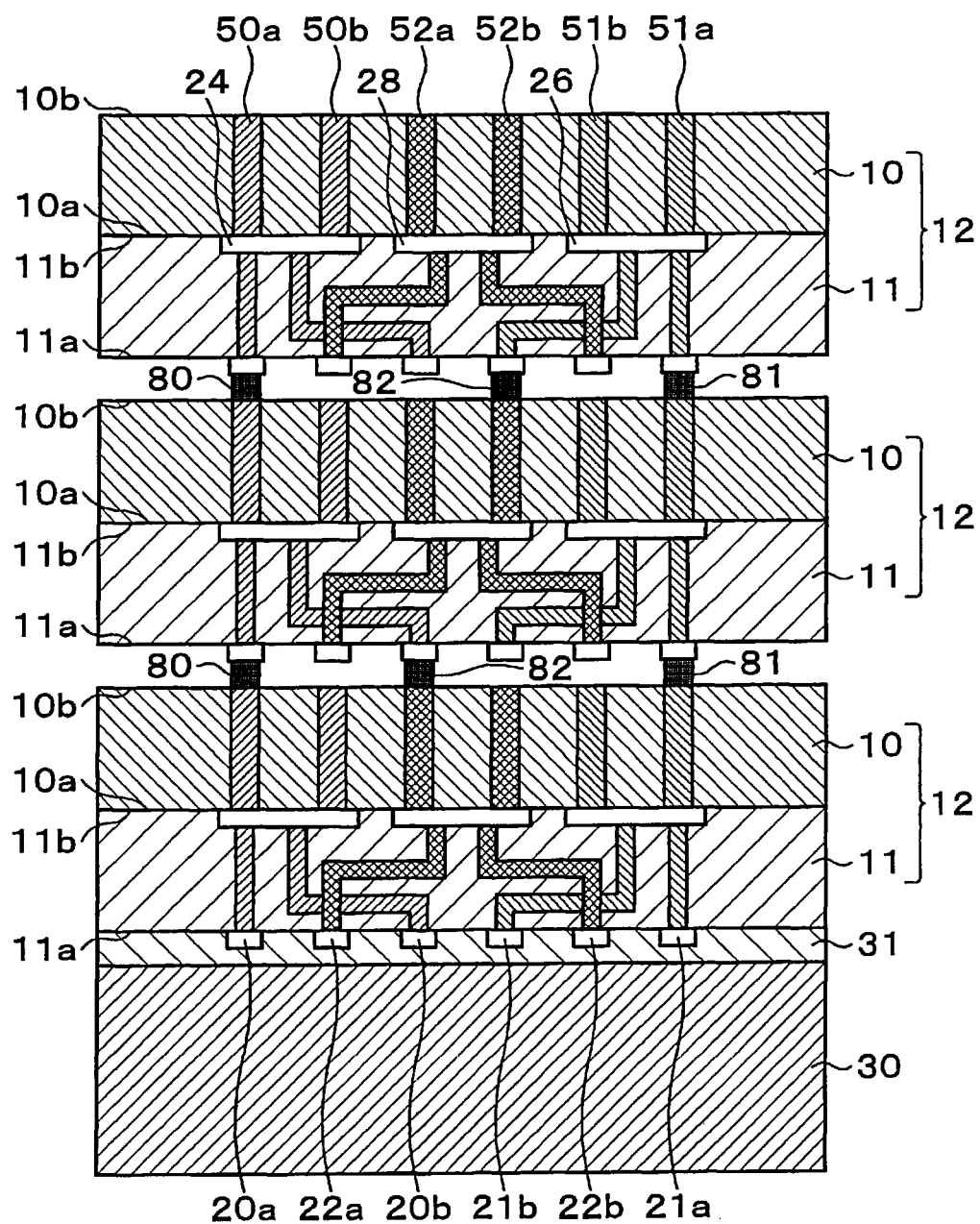
FIG. 10 is a cross-sectional view illustrating a state in which multiple wafers are stacked.

In the above case, the multiple semiconductor chips 12 are stacked to form a program "0, 1". This indicates an address of a defective memory cell that is detected through electrical testing of the circuit performed in the step (S2) above. Therefore, in the step (S9), the specific through-hole electrode for forming the back bumps (80~81) is selected from among the through-hole electrodes (50~52) based on the address of the above defective memory cell. For example, when the address of the defective memory cell is "1, 0", the third back bump 82 of the first wafer 10 is connected to the first front bump (20b) of the second device layer 11 as illustrated in FIG. 10, and the third back bump 82 of the second wafer 10 is connected to the second front bump (21b) of the third device layer 11. Thereby, the program "1, 0" is formed. In this manner, the address of the defective memory cell is recorded (step (S11) in FIG. 1).

When the address of the defective memory cell is recorded, the defective memory cell is replaced with a redundant memory cell in the redundant circuit, thus relieving (step (S12) in FIG. 1).

Figure 11:
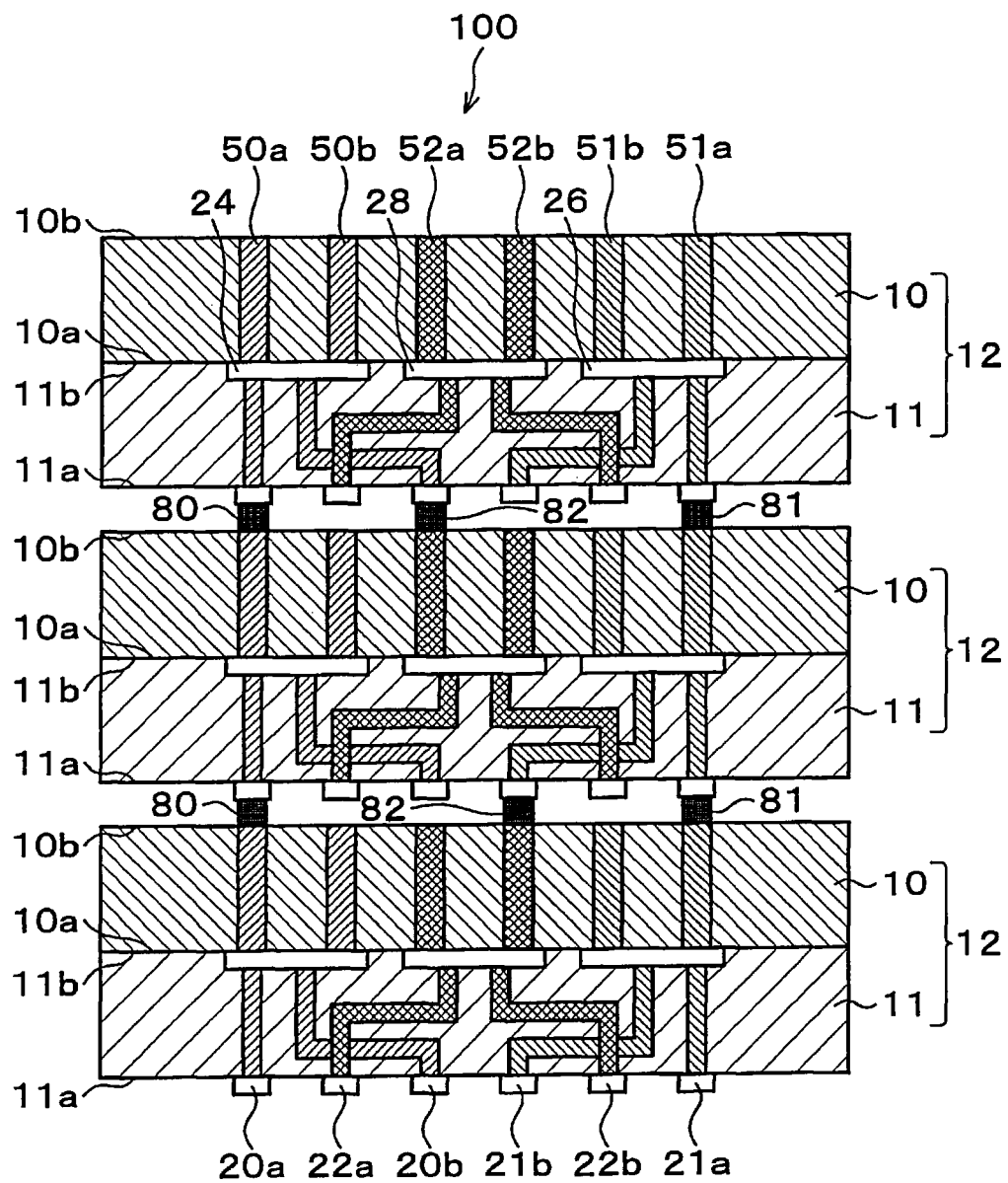
FIG. 11 is a cross-sectional view schematically illustrating a structure of a semiconductor device.

As illustrated in FIG. 11, the support wafer 30 in the backmost layer is removed. This removal of the support wafer 30 is performed by, for example, weakening the adhesiveness of the adhesive 31 by heating the support wafer 30 and the semiconductor chip 12. In this manner, a semiconductor device 100 having the vertically stacked semiconductor chips 12 is manufactured (step S13 in FIG. 1).

According to the embodiment described above, the back bumps (80~82) on one of the wafers 10 are connected to the front bumps (20~22) of another device layer 11, and thereby the back bumps (80~82) can function as programmable bumps. For example, even when each of the first to third semiconductor chips 12 has the same device layer 11 as the others, where to connect the back bumps (80~82) is selected individually to allow programming.

In the step (S9), the back bumps (80~82) are selectively formed on either one of the paired through-hole electrodes (50, 51, 52), respectively. In the step (S10), the third back bump 82 is connected to the first (20b) or second (21b) front bump. For example, when the third back bump 82 is connected to the second front bump (21b), the third through-hole electrode 52 for programming is connected to the second through-hole electrode (51a) connected to the ground line. Therefore, the program "0" is recorded. For example, when the third back bump 82 is connected to the first front bump (20b), the third through-hole electrode 52 for programming is connected to the first through-hole electrode (50a) connected to the power supply line. Therefore, program "1" is recorded. When the programming is performed in this manner, the address of the defective memory cell in the semiconductor chip 12 is recorded in the step (S11). Thereby, in the step (S12), the defective memory cell is replaced with a redundant memory cell in the redundant circuit based on the recorded address of the defective memory cell, thereby relieving. Therefore, the yield of the semiconductor devices 100 is improved. Even when a wafer stacking method is used as is the case with the present embodiment, the defective memory cell is replaced when stacking the wafers 10, and the embodiment is particularly effective in the wafer stacking method.

For forming the back bumps (80~82) in the step (S9), the template 60 provided with the paired electrodes (61~63) of switchable polarities is used. Therefore, by switching the polarities of each pair of electrodes (61~63), the back bump (80, 81 or 82) is appropriately formed on a desired through-hole electrode (50, 51 or 52) of the paired through-hole electrodes (50, 51 or 52). In this embodiment, the three stacked semiconductor chips 12 have the same structures except for the back bumps (80~82). Namely, the three semiconductor chips 12 can be produced by the same entire process, including the mask used in the photolithography step. Although the same multiple semiconductor chips 12 are stacked, by switching the positions of the back bumps (80~82), making possible to have relieving of a defective memory cell.

The embodiment has been described by an example where the power supply line is used as the first signal line, but it is not limited to a power supply line, and another signal line may be used. Also, the second signal line is not limited to a ground line, and another signal line may be used. In any case, the program is appropriately formed by connecting the third through-hole electrode 52 to the different first or second signal line.

Although the above embodiment has been described by referring to an example where the memory cell (memory element) is used as the electronic element, the embodiment may be applied to other electronic elements such as a logic element. Namely, according to the method of the embodiment, a defective logic element is replaced with a redundant logic element, thereby relieving.

In the embodiment described above, the back bumps function as programmable bumps, and the program records the address of the defective memory cell. However, the embodiment can be used for another purpose by changing the connection manner of the back bumps. For example, it is also effective to employ the embodiment for assigning an ID to a semiconductor chip.

Figure 12:
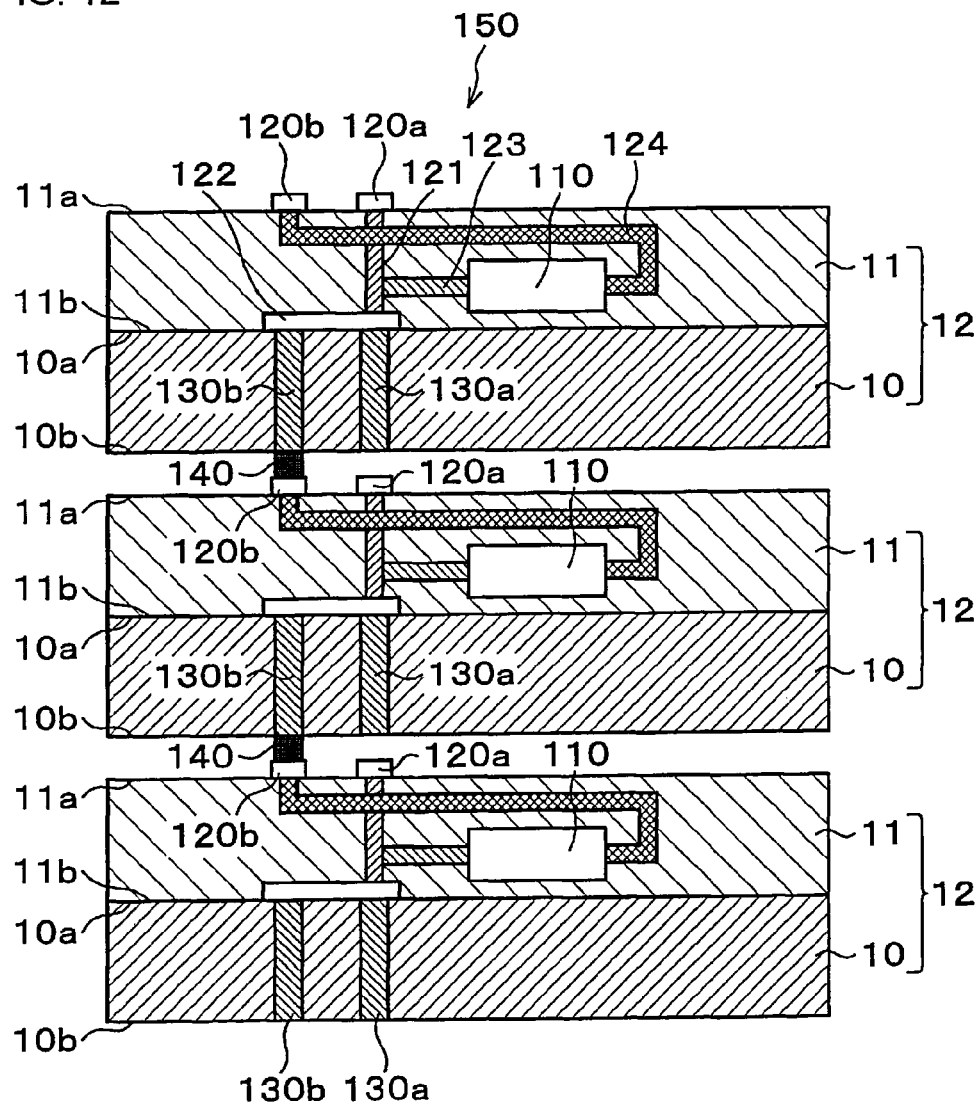
FIG. 12 is a cross-sectional view schematically illustrating a structure of a semiconductor device of another embodiment.

As illustrated in FIG. 12, a device layer 11 is formed on a wafer 10. A counter 110 is formed in the device layer 11. A pair of front bumps 120 is formed at a front surface (11a) of the device layer 11. A first front bump (120a) in the pair of front bumps 120 is connected through wiring 121 to a shared wiring 122 formed on a back-surface (11b) side of the device layer 11. The wiring 121 is connected to a wiring 123 connected to the input side of the counter 110. A second front bump (120b) in the pair of front bumps 120 is connected to an output side of the counter 110 through a wiring 124.

Next, a pair of through-hole electrodes 130 penetrating through the wafer 10 in a thickness direction is formed. The paired through-hole electrodes 130 are connected to each other by connecting to the shared wiring 122. A first through-hole electrode (130a) in the pair of through-hole electrodes 130 is connected to the first front bump (120a) through the wiring 121, and is also connected to the input side of the counter 110 through the wiring 123. A method for forming the pair of through-hole electrodes 130 is substantially the same as the steps (S3)~(S6) in the above embodiment, and therefore a detailed description is omitted here.

A template 60 provided with a pair of electrodes 61 having opposite polarities is arranged on a back-surface (10b) side of the wafer 10. The paired electrodes 61 are arranged in positions corresponding to the paired through-hole electrodes 130. Then, after a plating solution is filled, for example, between the back surface (10b) of the wafer 10 and the template 60, voltage is applied across the paired electrodes 61 by assigning opposite polarities, and thereby the voltage is applied across the paired through-hole electrodes 130 with opposite polarities. A back bump 140 is formed on only a second through-hole electrode (130b) in the pair of through-hole electrodes 130. Namely, the back bump 140 is formed on only the predetermined second through-hole electrode (130b). Unlike the first embodiment, the objective is not to replace a defective memory cell but to form the back bump 140 on the predetermined second through-hole electrode (130b). Accordingly, it is not necessary to provide switchable electrodes as the paired electrodes 61 in the template 60, and the electrode opposite the second through-hole electrode (130b) may be set as a positive electrode and the other electrode as a negative electrode.

The wafers 10 (semiconductor chips 12) provided with the device layers 11 are stacked. This embodiment will be discussed by an example where the wafers 10 are stacked in descending order. In the following, the frontmost wafer 10 (the device layer 11 and the semiconductor chip 12) is referred to as a first wafer 10 (a first device layer 11 and a first semiconductor chip 12), and the back wafers are referred to as second and third wafers 10 (a second device layer 11 and a second semiconductor chip 12, and a third device layer 11 and a third semiconductor chip 12) respectively in descending order. The example in FIG. 12 is discussed by referring to a case where three wafers 10 are stacked. However, the number of the stacked wafers 10 is not limited to three, and any other number may also be employed.

The back bump 140 of the first wafer 10 is connected to the second front bump (120b) of the second device layer 11. Likewise, the back bump 140 of the second wafer 10 is connected to the second front bump (120b) of the third device layer 11.

A support wafer 30 is removed to manufacture a semiconductor device 150.

In this case, the counters 110 in the first, second and third device layers 11 of the first, second and third semiconductor chips 12 are connected in series through the back bumps 140. Thereby, the counters 110 are interposed in series in the path of the through-hole electrodes 130 connecting the semiconductor chips 12. When a signal is provided to the path of the through-hole electrode 130, the signal successively passes through the counters 110 on the respective semiconductor chips 12. When the signal passes through each counter 110, a count function produces an ID signal identifying each semiconductor chip 12, and outputs it to a comparator (not illustrated). The comparator compares it with a chip select signal provided from another through-hole electrode, and selects the semiconductor chip 12 in question when they match. When they do not match, the semiconductor chip 12 in question is not selected. In this manner, the ID is assigned to each semiconductor chip 12. In this embodiment, all three stacked semiconductor chips 12 have the same structures. Therefore, the three semiconductor chips 12 are manufactured by the same entire process, including the mask used in the photolithography step. Even when the same multiple semiconductor chips 12 are stacked, a desired circuit can be interposed in series in the path of the through-hole electrodes 130 by selectively determining the positions of the back bumps 140, and the ID signal can be assigned to each semiconductor chip 12.

In the embodiments described above, the back bumps function as programmable bumps. Instead of the back bumps, however, wiring connecting the through-hole electrodes may be set to function as programmable wirings. A description will be given of a method for manufacturing a semiconductor device provided with such programmable wiring as well as the semiconductor device manufactured by a method according to another embodiment of the present invention.

Figure 13:
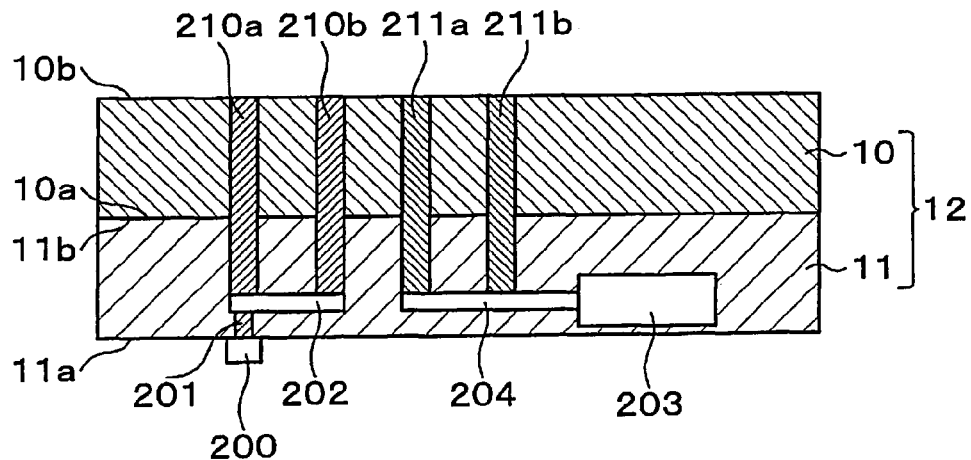
FIG. 13 is a cross-sectional view illustrating a state in which a device layer is formed on a wafer.

As illustrated in FIG. 13, a device layer 11 is formed on a wafer 10. The same as in the above embodiment, the wafer 10 and the device layer 11 form a semiconductor chip 12.

A front bump 200 is formed at a front surface (11a) of the device layer 11 as a device-side bump. The front bump 200 is connected through a wiring 201 to a first shared wiring 202 serving as another shared wiring formed at the device layer 11. The device layer 11 is provided with a circuit 203 that is a circuit to activate the semiconductor chip 12 when a chip select signal is received. The circuit 203 is connected to a second shared wiring 204 serving as a shared wiring. The device layer 11 is also provided with other circuits (not illustrated) such as a circuit including, for instance, memory cells.

As a pair of through-hole electrodes and a pair of vertical electrodes that penetrate through the wafer 10 (and a part of the device layer 11) in the thickness direction and reach a back surface (10b) of the wafer 10, a pair of first through-hole electrodes 210 and a pair of second through-hole electrodes 211 are formed. The paired first through-hole electrodes 210 are connected to the first shared wiring 202, and the paired second through-hole electrodes 211 are connected to the second shared wiring 204. For the sake of illustration, one of the paired first through-hole electrodes 210, and particularly the through-hole electrode that is externally connected for transmitting the signal, is referred to as a "first through-hole electrode (210*a*)", and the other through-hole electrode is referred to as a "first through-hole electrode (210*b*)." Also, one of the paired second through-hole electrodes 211, and particularly the through-hole electrode that is connected to a back-surface wiring 250, is referred to as a "second through-hole electrode (211*a*)," and the other through-hole electrode is referred to as a "second through-hole electrode (211*b*)." In this embodiment, since programming for supplying the chip select signal is performed using these through-hole electrodes (210*a*, 210*b*, 211*a*, 211*b*), these four through-hole electrodes (210*a*, 210*b*, 211*a*, 211*b*) will be collectively referred to hereinafter as "programmable through-hole electrode cells 13." Method for forming these pairs of the first through-hole electrodes 210 and the second through-hole electrodes 211 are substantially the same as the steps (S3)~(S6) in the above embodiment, and therefore a detailed description thereof is omitted here.

Figure 14:
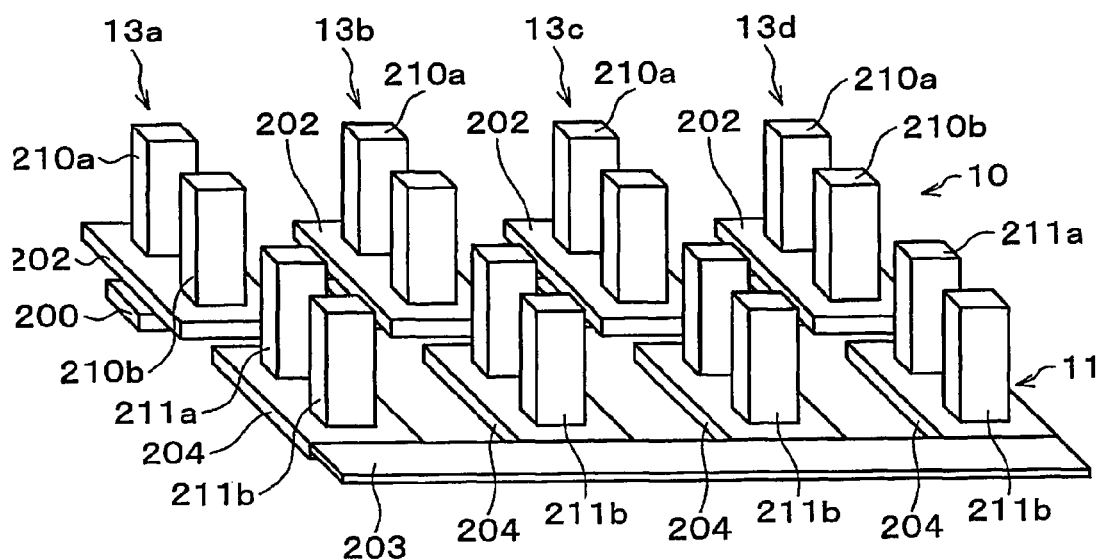
FIG. 14 is a view schematically illustrating a wafer and a device layer.

As illustrated in FIG. 14, the one semiconductor chip 12 is provided on a horizontal plane with the multiple (four in this embodiment) programmable through-hole electrode cells 13. For the sake of illustration, these electrodes arranged from left to right in the illustrated example are referred to as the "first, second, third and fourth programmable through-hole electrode cells (13*a*, 13*b*, 13*c*, 13*d*)," respectively.

Figure 15:
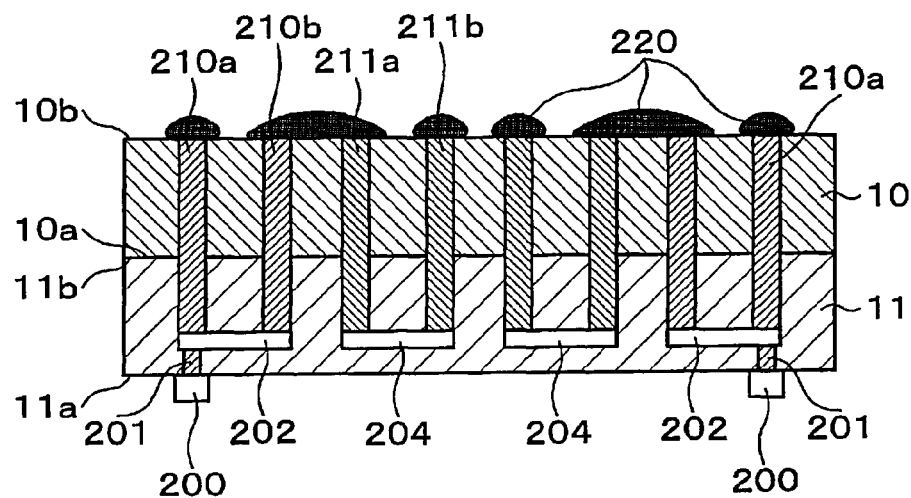
FIG. 15 is a cross-sectional view illustrating a state in which a plating solution is supplied onto a back surface of a wafer.

As illustrated in FIG. 15, a plating solution 220 is supplied onto a back surface (10*a*) of the wafer 10. On the back surface (10*a*) of the wafer 10, for example, portions around the through-hole electrodes (210, 211) where plating is to be formed and the portions where a later-described back-surface wiring 250 is to be formed are made hydrophilic relative to other portions. For example, the portion where the back-surface wiring 250 is to be formed is a straight portion between the through-hole electrodes (210*b*, 211*a*). The plating solution 220 may be supplied to the entire back surface (10*a*). However, by supplying the plating solution 220 only on the portions set to be hydrophilic relative to the rest as described above, the current paths are formed efficiently, and the wiring is formed accurately in a later plating step. Such relative hydrophilization may be performed by positively hydrophilizing a portion to be plated, or by hydrophobizing other portions not to be plated. Alternatively, hydrophilization and hydrophobization may both be performed. In this manner, as illustrated in FIG. 15, the plating solution 220 is supplied to portions around the through-hole electrodes (210, 211) on the back surface (10*a*) of the wafer 10.

Figure 16:
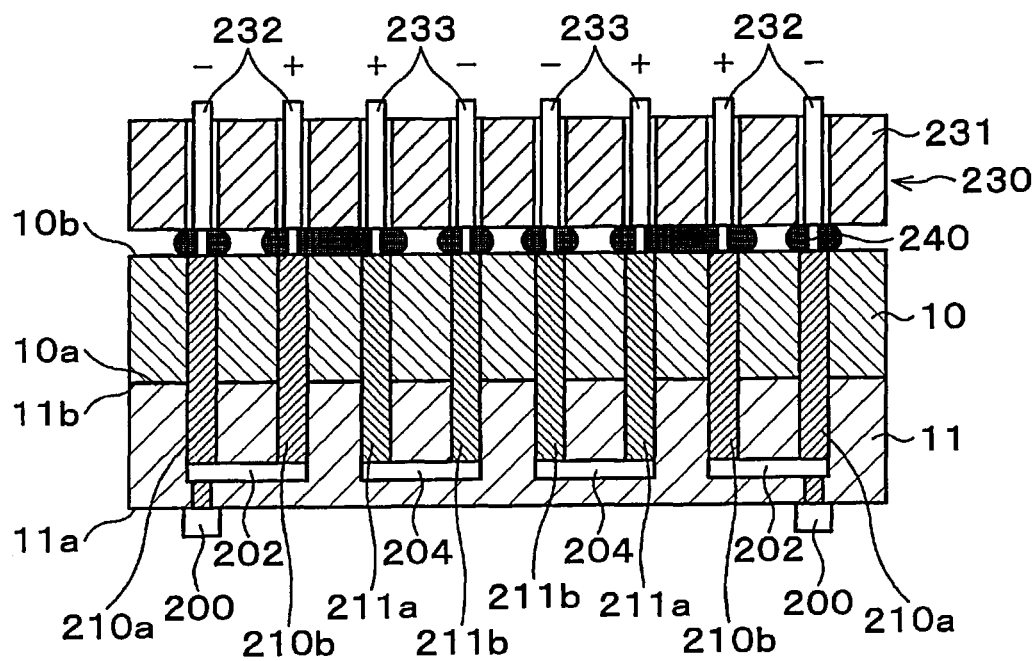
FIG. 16 is a cross-sectional view illustrating a state in which a bridge is formed between an electrode and a through-hole electrode, and electrical testing of the through-hole electrode and a circuit is performed.

As illustrated in FIG. 16, a template 230 serving as a jig for forming wiring is arranged on the back-surface (10*b*) side of the wafer 10. The template 230 has a base body 231 having a surface opposite the wafer 10, and multiple pairs of electrodes (232, 233) which are arranged on the surface of the base body 231 and serve as a pair of opposing electrodes allowing switching of polarities. The pairs of the electrodes (232, 233) are arranged in positions corresponding to the pairs of the through-hole electrodes (210, 211), respectively. That is; the pair of the first electrodes 232 corresponds to the pair of the first through-hole electrodes 210, and the pair of the second electrodes 233 corresponds to the pair of the second through-hole electrodes 211.

Voltage is applied across the paired electrodes (232, 233), and the voltage is applied across the paired through-hole electrodes (210, 211). This forms bridges 240 between the respective electrodes (232, 233) and the corresponding through-hole electrodes (210, 211) as illustrated in FIG. 16. These bridges 240 grow from the electrodes that are in contact with the plating solution 220 and are on the negative side, and reach the opposing electrodes on the positive side. In this processing, the polarities of the paired electrodes (232, 233) in the template 230 may be switched, whereby the bridges 240 are formed efficiently. By further applying the voltage, a fitting phenomenon occurs to connect reliably the electrodes (232, 233) to the corresponding through-hole electrodes (210, 211) through the bridges 240, respectively. In this state, voltage is applied to each pair of the through-hole electrodes (210 or 211) to perform electrical testing of the circuit 203 and the through-hole electrodes (210, 211).

Figure 17:
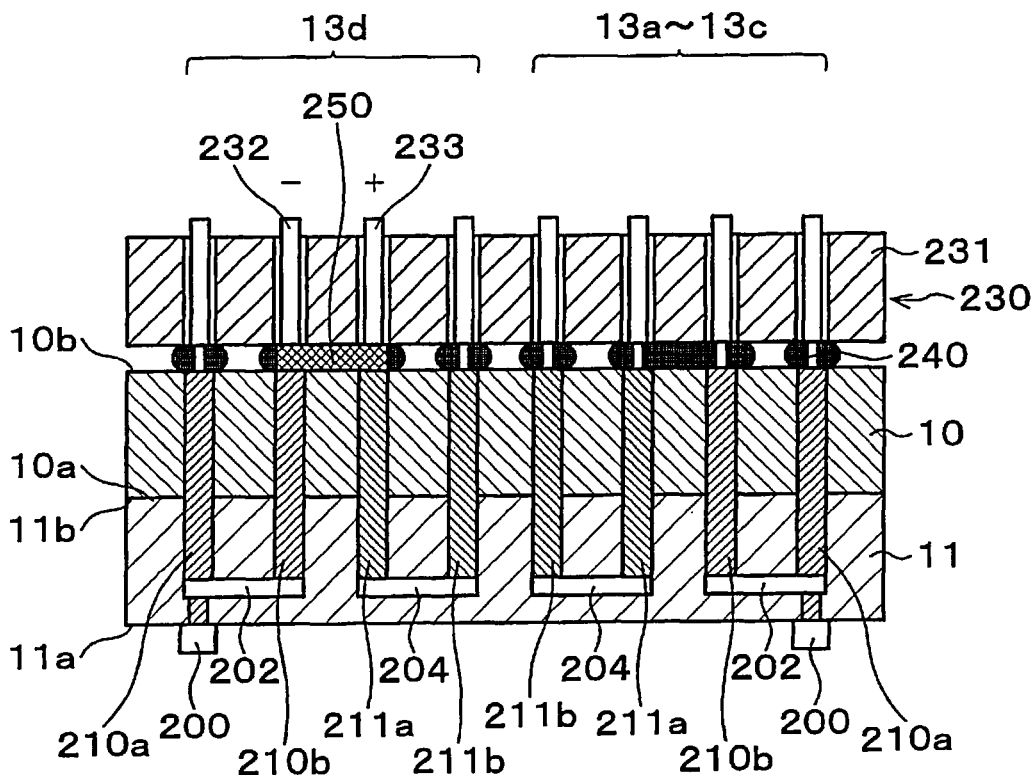
FIG. 17 is a cross-sectional view illustrating a state in which back-surface wiring is formed on a back surface of a wafer.

For example, as illustrated in FIG. 17, the back-surface wiring 250 which connects the first and second through-hole electrodes (210*b*, 211*a*) is formed as a connection wiring on the back surface (10*b*) of the fourth programmable through-hole electrode cell (13*d*). For applying a bias only across the first and second through-hole electrodes (210*b*, 211*a*) of the fourth programmable through-hole electrode cell (13*d*), a bias is applied across the first and second electrodes (232, 233) corresponding to these first and second through-hole electrodes (210*b*, 211*a*), respectively. Since a current path is formed between the first and second electrodes (232, 233) through the bridge 240, plating grows to form the back-surface wiring 250 between them. The voltage is not applied across the other electrodes (232, 233), and the back-surface wiring 250 is not formed in the first to third programmable through-hole electrode cells (13*a*~13*c*). Actually, in FIG. 17, the first to fourth programmable through-hole electrode cells (13*a*~13*d*) are aligned in a direction perpendicular to a sheet of the drawing, but these are illustrated in laterally aligned positions for the sake of illustration.

Figure 18:
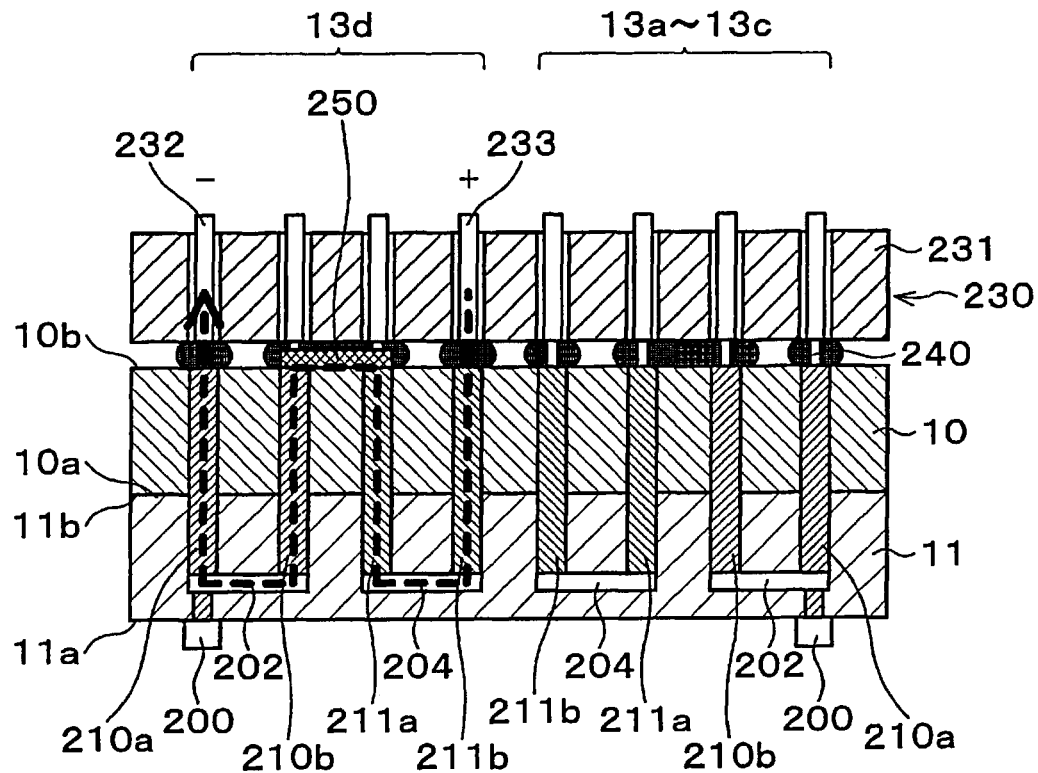
FIG. 18 is a cross-sectional view illustrating the state in which the back-surface wiring is formed on the back surface of the wafer.

Alternatively, a method illustrated in FIG. 18 can likewise form the back-surface wiring 250 which connects the first and second through-hole electrodes (210*b*, 211*a*) on the back surface (10*b*) of the fourth programmable through-hole electrode cell (13*d*). When the bias is applied only across the first and second through-hole electrodes (210*a*, 211*b*) of the fourth programmable through-hole electrode cell (13*d*), a current path indicated by an arrow in FIG. 18 is formed so that the back-surface wiring 250 is formed between the first and second through-hole electrodes (210*b*, 211*a*). At this time, a bias is not applied to the electrodes opposite the through-hole electrodes (210*b*, 211*a*).

Figure 19:
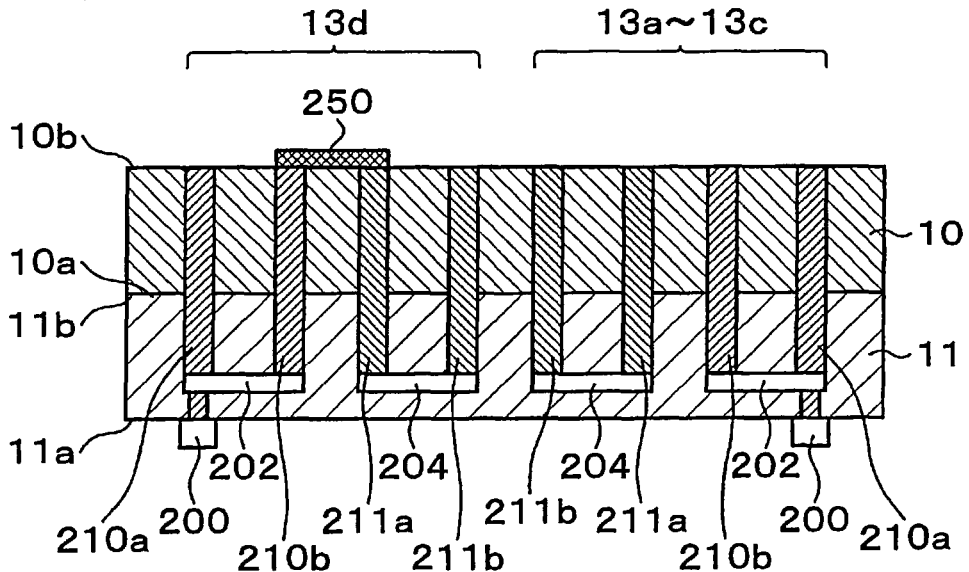
FIG. 19 is a cross-sectional view illustrating the state in which the back-surface wiring is formed on the back surface of the wafer.
Figure 20:
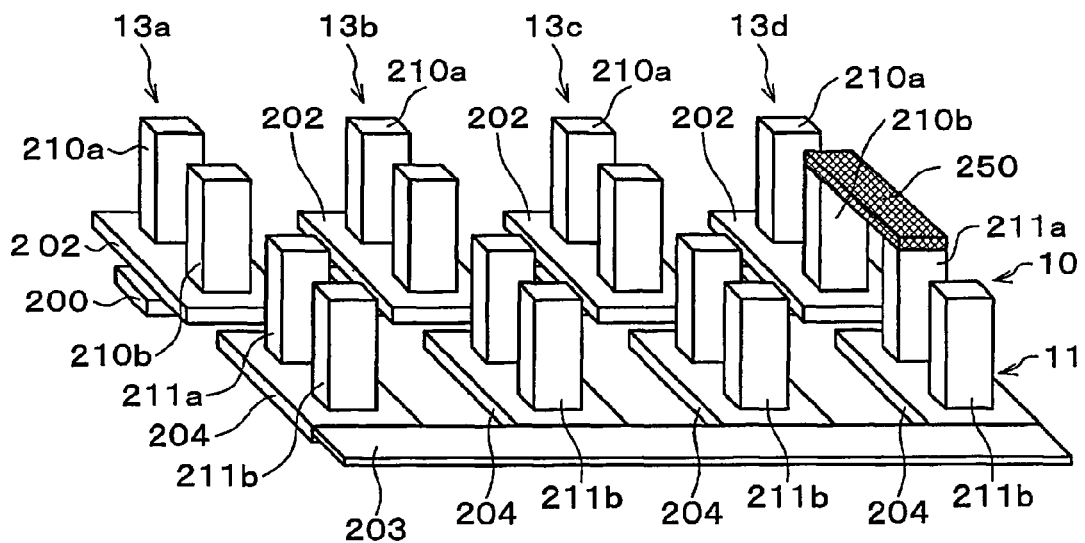
FIG. 20 is a view schematically illustrating a state in which back-surface wiring is formed on a fourth semiconductor chip.

As illustrated in FIG. 19, the template 230 is withdrawn. In this state, the bridges 240 between the respective electrodes (232, 233) and the corresponding through-hole electrodes (210, 211) are removed. Thereby, as illustrated in FIGS. 19 and 20, the back-surface wiring 250 is formed in the fourth programmable through-hole electrode cell (13*d*) to connect the paired first through-hole electrodes 210, the paired second through-hole electrodes 211 and the circuit 203.

Figure 21:
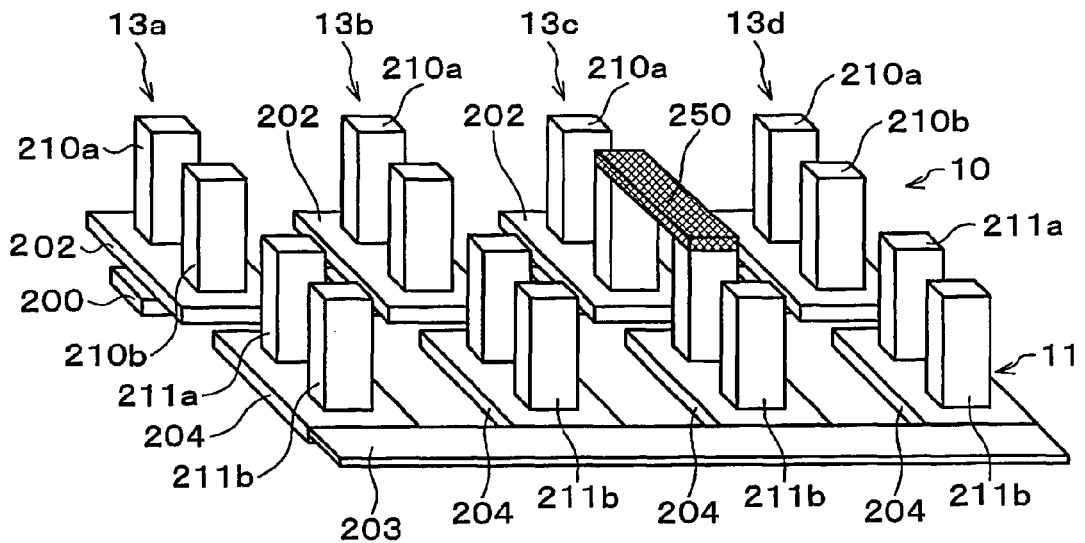
FIG. 21 is a view schematically illustrating a state in which back-surface wiring is formed on a third semiconductor chip.

Likewise, for example, in the third programmable through-hole electrode cell (13*c*), when the bias is applied only across the first and second through-hole electrodes (210*b*, 211*a*), the back-surface wiring 250 is formed at the third programmable through-hole electrode cell (13*c*) as illustrated in FIG. 21. In this embodiment, as described above, the back-surface wiring 250 is selectively formed in a desired programmable through-hole electrode cell 13.

The wafers 10 (semiconductor chips 12) provided with the device layers 11 are stacked. Thereby, the front bump 200 of a wafer 10 is connected to the first through-hole electrode (210*a*) on the back surface (10*b*) of an opposing wafer 10 stacked on the wafer 10. The four first through-hole electrodes (210*a*) provided in the programmable through-hole electrode cell 13 penetrate through the wafers 10 in the stacking direction to be connected to each other, and are further connected externally so that signals such as a chip select signal are transmitted.

Figure 22:
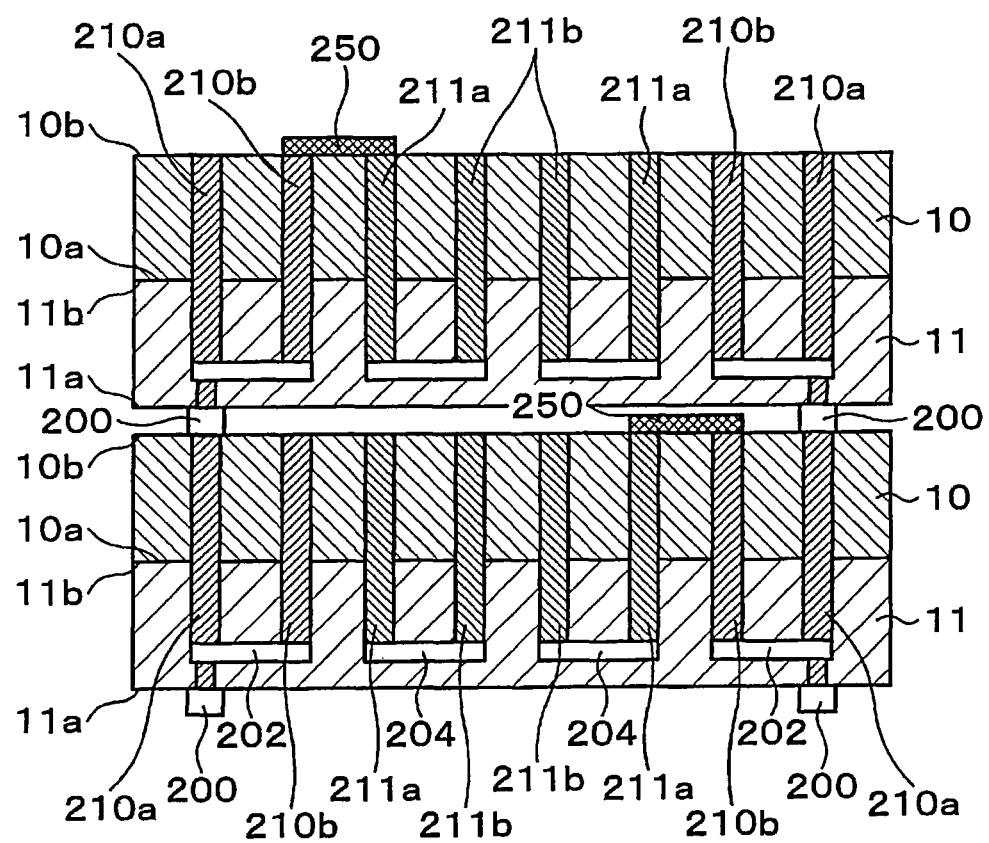
FIG. 22 is a cross-sectional view illustrating a state in which multiple wafers are stacked.
Figure 23:
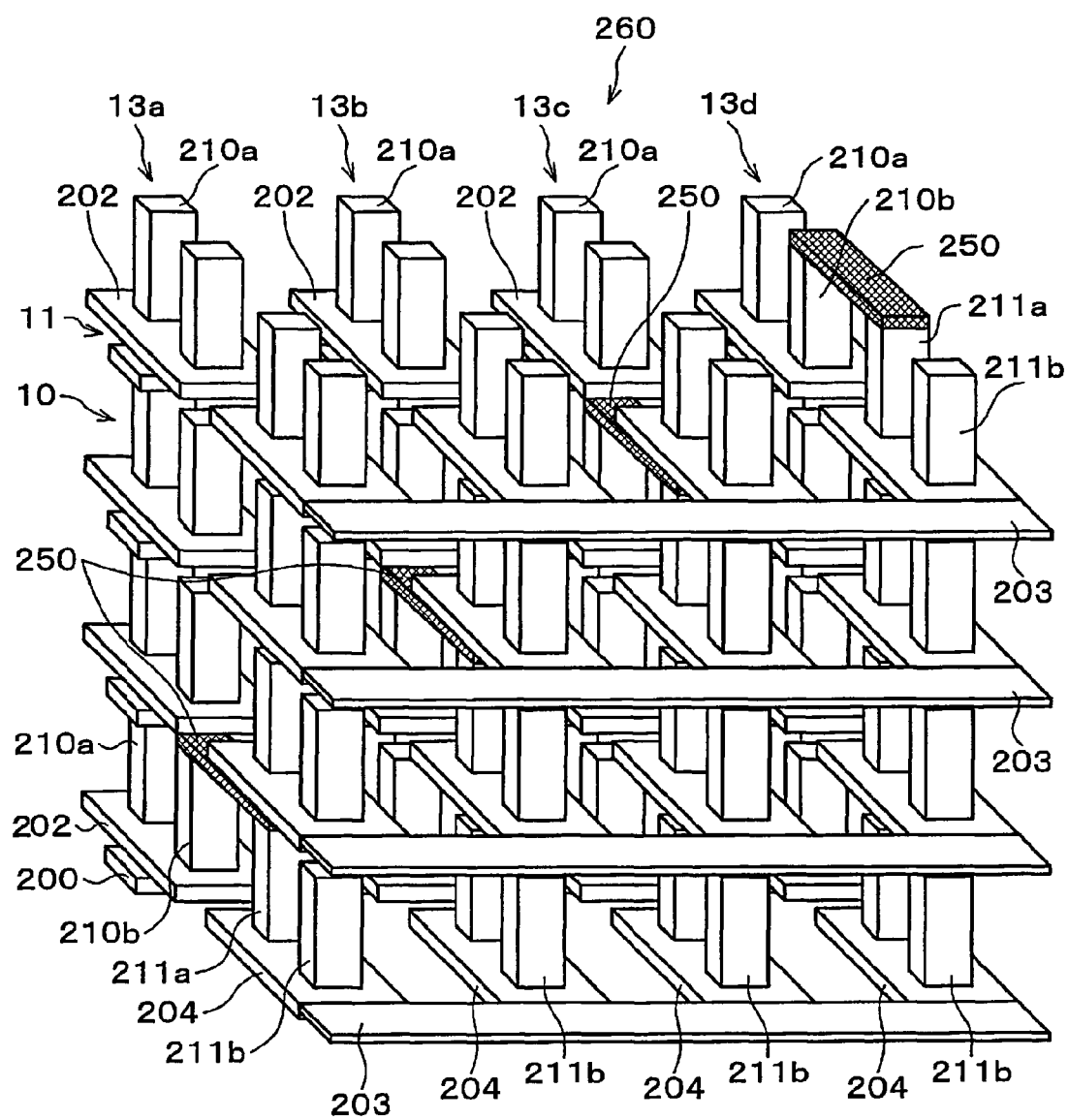
FIG. 23 is a view schematically illustrating a semiconductor device according to the embodiment.

In this manner, as illustrated in FIGS. 22 and 23, a semiconductor device 260 is manufactured by stacking multiple wafers 10 (semiconductor chips 12). The number of the stacked wafers 10 is not limited to that of the illustrated example, and any other number may be employed.

In the semiconductor device 260 described above, a select chip signal for selecting one of the stacked semiconductor chips 12 is transmitted to the first through-hole electrode (210a) in each of the programmable through-hole electrode cells (13a~13d). For example, when only the semiconductor chip 12 in the frontmost layer is to be activated, the signal activating the semiconductor chip 12 is transmitted to only the first through-hole electrode (210a) provided in the programmable through-hole electrode cell (13d). Simultaneously, a signal deactivating the semiconductor chip 12 is transmitted to the first through-hole electrode (210a) of each of the programmable through-hole electrode cells (13a~13c). Thereby, the signal activating the semiconductor chip 12 is transmitted to only the circuit 203 connected to the fourth programmable through-hole electrode cell (13d) for which the back-surface wiring 250 is formed. Through the control by the circuit 203, only the semiconductor chip 12 in the frontmost layer is activated. Likewise, the signal activating the semiconductor chip 12 in the layer in question is transmitted only to the circuit 203 connected to the third programmable through-hole electrode cell (13c) in the second front layer, the circuit 203 connected to the second programmable through-hole electrode cell (13b) in the third layer, and the circuit 203 connected to the first programmable through-hole electrode cell (13a) in the bottom layer.

In the present embodiment, the back-surface wiring 250 connecting the first through-hole electrode (210b) and second through-hole electrode (211a) can function as the programmable wiring. More specifically, the back-surface wiring 250 is formed in one programmable through-hole electrode cell 13 selected from among the programmable through-hole electrode cells (13a~13d), and thereby the circuit 203 connected to the back-surface wiring 250 in question is selected and activated. Therefore, the semiconductor chip 12 is appropriately selected. All the stacked semiconductor chips 12 have completely the same structure except for the position of the back-surface wiring 250. Therefore, the semiconductor chips 12 are each manufactured in volume by the same entire process, including the mask used for the patterning.

For forming the back-surface wiring 250, the template 230 is used, including the pair of electrodes (232, 233) whose polarities are switchable. Therefore, by switching the polarities of the paired electrodes (232, 233), the back-surface wiring 250 is appropriately formed on the desired programmable through-hole electrode cell 13 among the programmable through-hole electrode cells (13a~13d).

At the back surface (10b) of the wafer 10, the portions where plating is to be formed are made hydrophilic relative to the portions where plating is not to be formed. Therefore, the current paths between the electrodes (232, 233) and the through-hole electrodes (210, 211) are formed efficiently. Thereby, the bridge 240 and the back-surface wiring 250 are formed appropriately.

The embodiment above has been described by referring to the case where a semiconductor chip 12 is appropriately selected by the back-surface wiring 250. However, a semiconductor device 260 of this embodiment can be structured to perform another function. For example, it may be structured to select one semiconductor chip 12 in each of the stacked wafers 10 so that multiple stacked wafers 10 operate, as a whole, to record the program. For example, the address of a defective memory cell is recorded. In this case, for example, if the semiconductor device 260 has a redundant circuit including a redundant memory cell to be replaced with a defective memory cell, the defective memory cell is replaced based on the recorded address of the defective memory cell. This improves the yield of the semiconductor devices 260.

Figure 24:
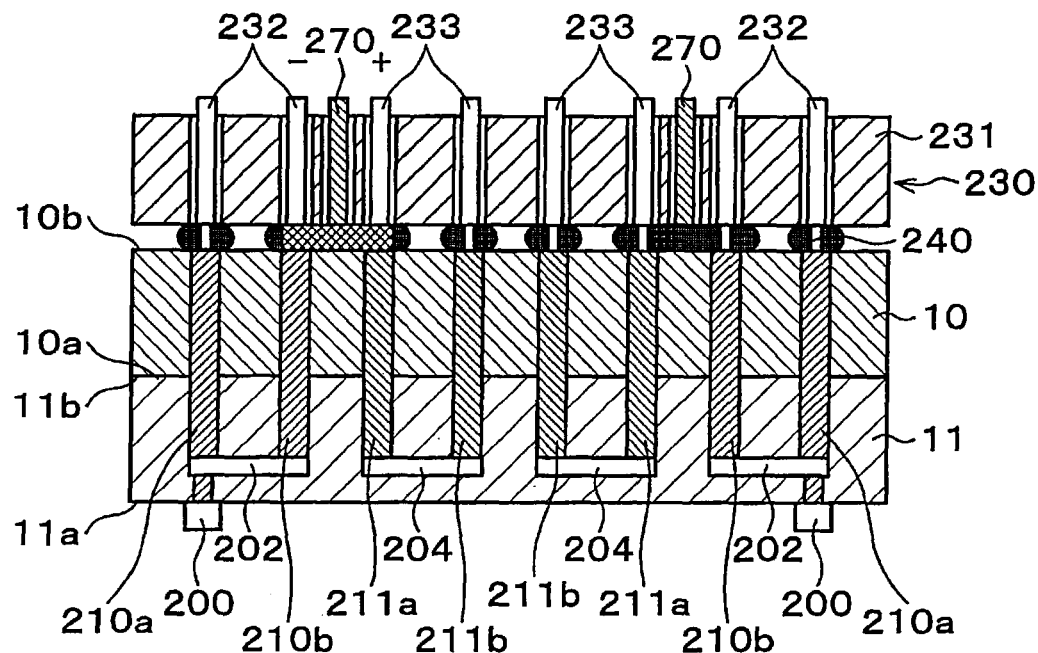
FIG. 24 is a cross-sectional view illustrating a state in which an auxiliary electrode is arranged on a template.
Figure 25:
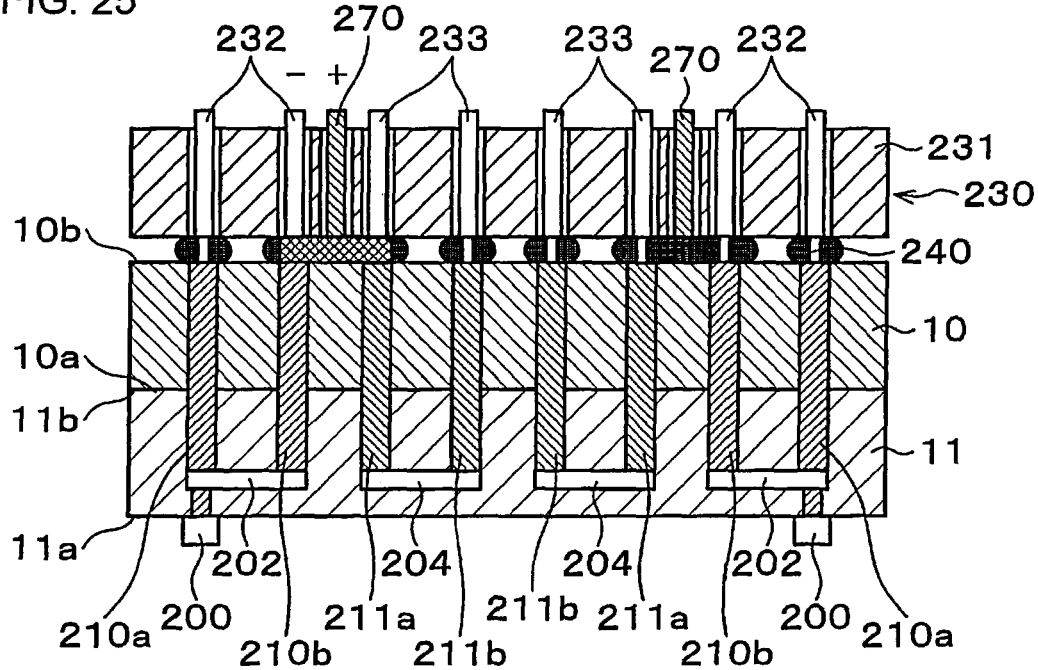
FIG. 25 is a cross-sectional view illustrating a state in which a bias is applied across a first electrode and an auxiliary electrode to form back-surface wiring.

In the template 230 of the above embodiment, an auxiliary electrode 270 may be arranged as an opposing auxiliary electrode between the first and second electrodes (232, 233) adjacent to each other, as illustrated in FIGS. 24 and 25.

When the back-surface wiring 250 is formed, as illustrated in FIG. 24, a bias is first applied across the first and second electrodes (232, 233) corresponding to the first and second through-hole electrodes (210b, 211a), respectively. Thereby, the back-surface wiring 250 is formed. This method for forming the back-surface wiring 250 is substantially the same as that in the embodiment illustrated in FIG. 17, and therefore a detailed description is not given here. Alternatively, the method for forming the back-surface wiring 250 illustrated in FIG. 18 may also be employed.

Then, as illustrated in FIG. 25, a bias is applied across the first electrode 232 and the auxiliary electrode 270. Thereby, the plating of the back-surface wiring 250 grows even more to make the wiring thicker. In the illustrated example, the bias is applied across the first electrode 232 and the auxiliary electrode 270. However, the bias may be applied across the second electrode 233 and the auxiliary electrode 270.

In this case, the plating of the back-surface wiring 250 grows in two stages, making the wiring thicker so as to improve the wiring reliability of the back-surface wiring 250.

Figure 26:
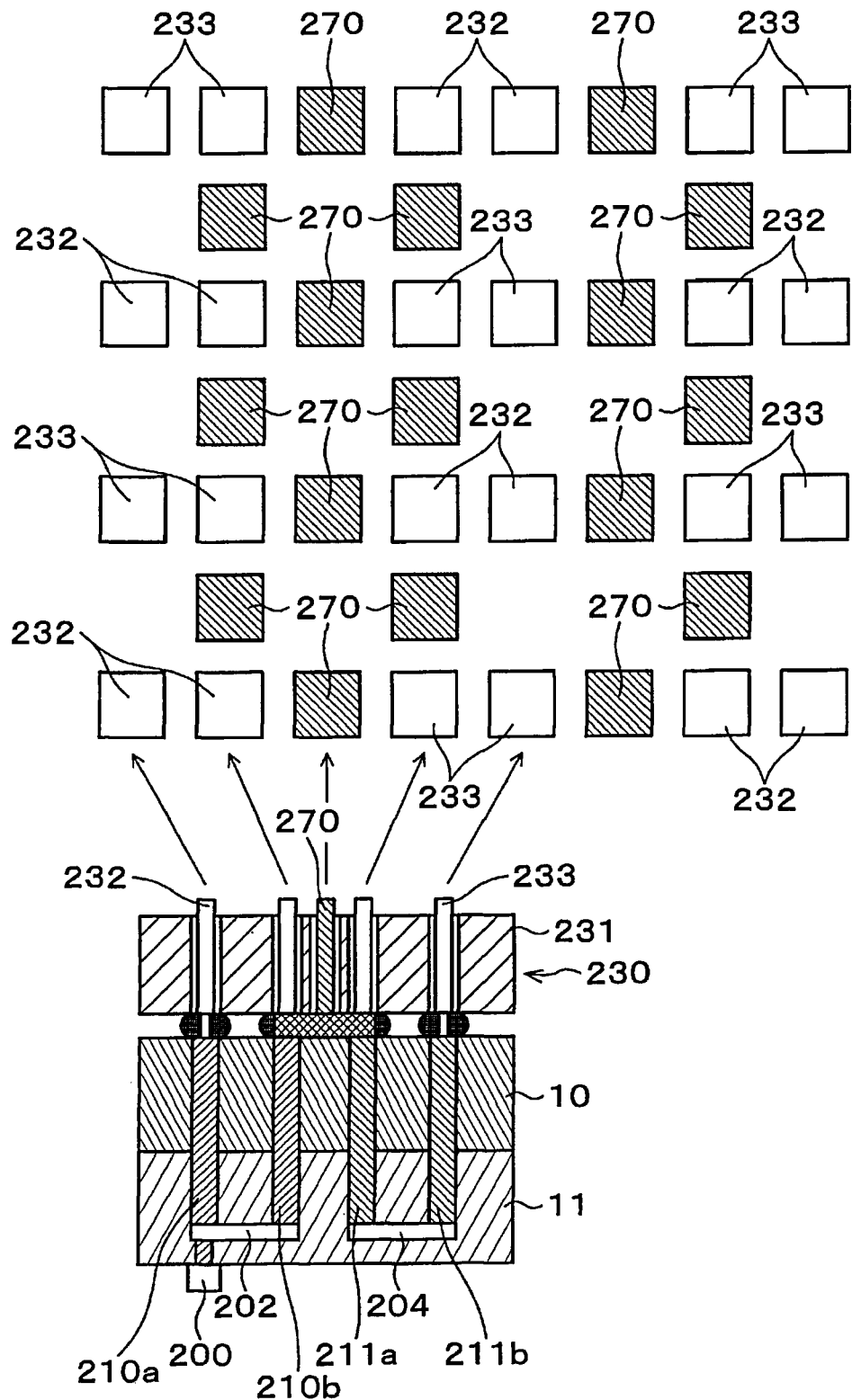
FIG. 26 is a plan view illustrating the arrangement of electrodes and auxiliary electrodes.
Figure 27:
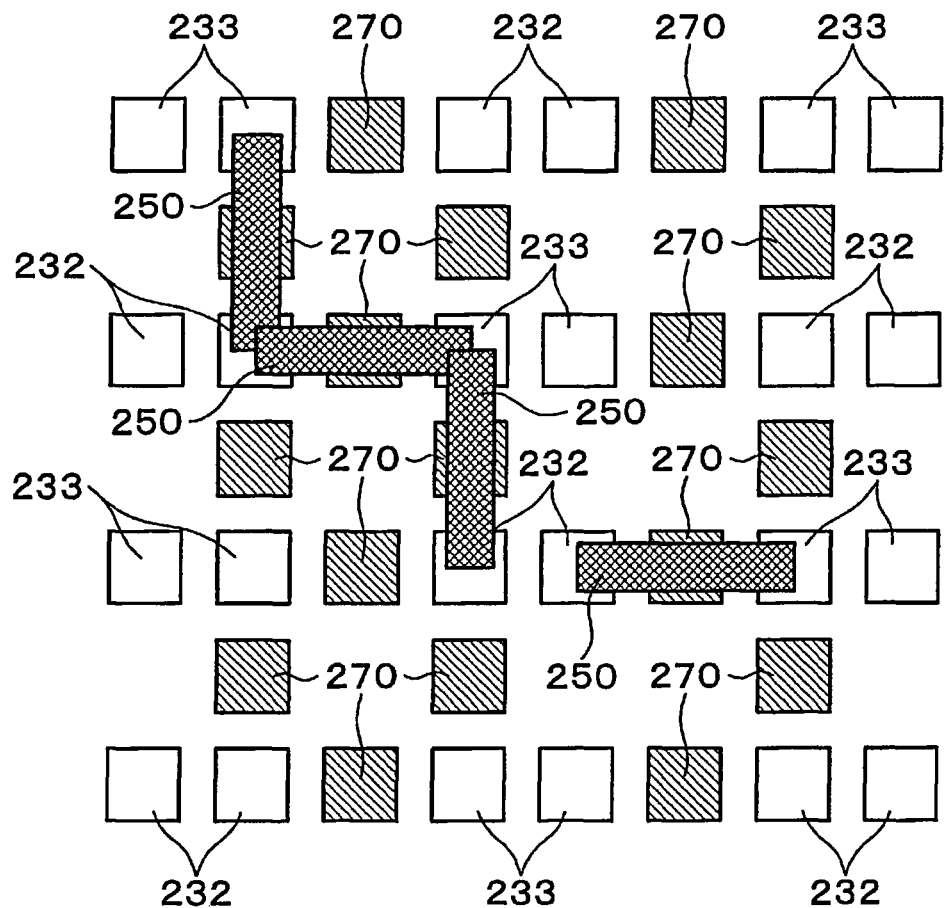
FIG. 27 is a view illustrating a state in which back-surface wiring is formed in FIG. 26.

In the template 230 of the above embodiment, the pairs of the electrodes (232, 233) may be arranged alternately in a plan view as illustrated in FIG. 26. In this case, the auxiliary electrode 270 is arranged between the first and second electrodes (232, 233). In this case, as illustrated in FIG. 27, the back-surface wiring 250 can be formed in any one of the perpendicular and parallel directions in the plan view.

Figure 28:
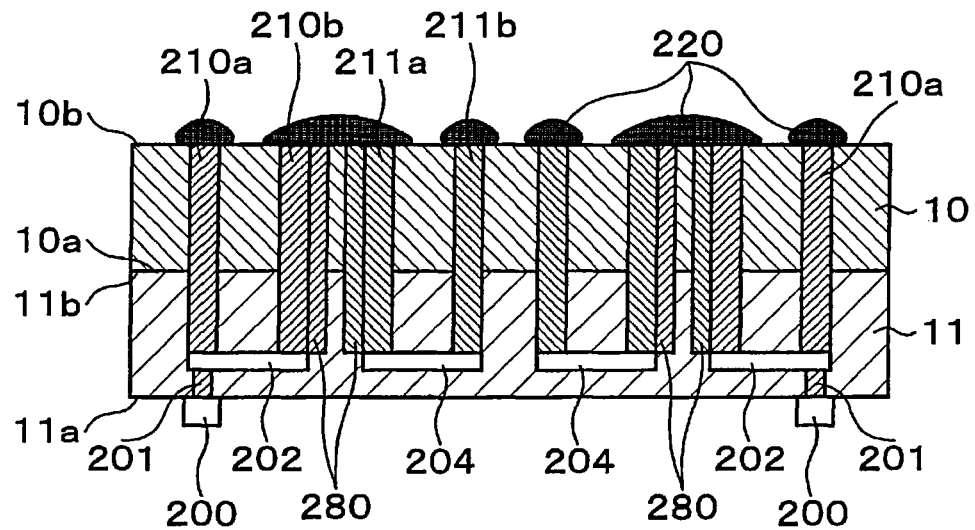
FIG. 28 is a cross-sectional view of a through-hole electrode in yet another embodiment.
Figure 29:
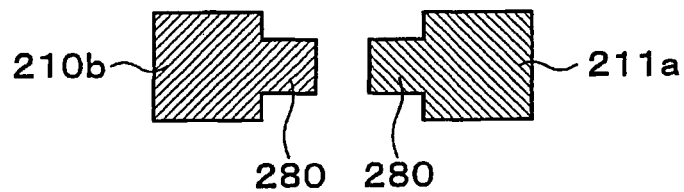
FIG. 29 is a view illustrating a lateral cross section of a through-hole electrode in such an embodiment.

For the first and second through-hole electrodes (210, 211) adjacent to each other in the embodiment above, protrusions 280 may be provided on their respective opposing surfaces as illustrated in FIG. 28. For example, as illustrated in FIG. 29, the first and second through-hole electrodes (210b, 211a) are rectangular in a plan view, and at their respective opposing surfaces the rectangular protrusions 280 are formed. The protrusions 280 are formed similarly to the through-hole electrodes (210, 211), and are made of a conductive material.

Figure 30:
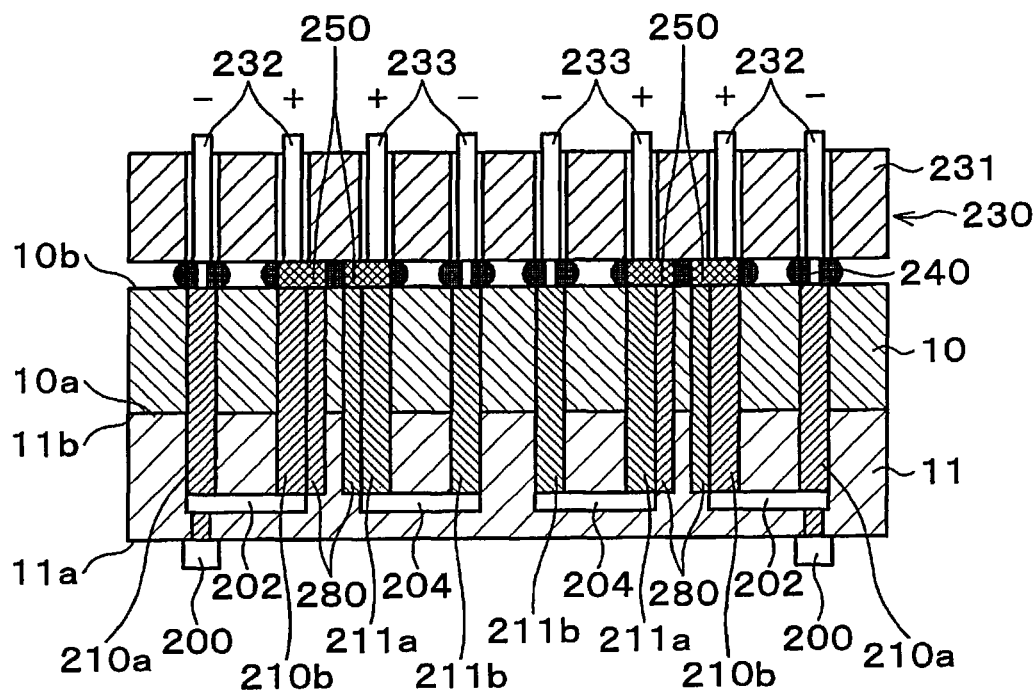
FIG. 30 is a cross-sectional view illustrating a state in which plating wiring is formed by using a through-hole electrode in such an embodiment.

In the above case, the distance between the first and second through-hole electrodes (210b, 211a) is short, which facilitates formation of the plating wiring (the back-surface wiring 250 and others) as illustrated in FIG. 30.

In the above embodiment, the paired first through-hole electrodes 210 are connected to the front bump 200 through the wiring 201 and the first shared wiring 202. However, the paired through-hole electrodes may penetrate through the wafer 10 and the device layer 11 in the thickness direction, and may be short-circuited to a front bump formed on the front surface (11a) of the device layer 11. The method for manufacturing the semiconductor device in the above case as well as the semiconductor device manufactured by the manufacturing method will be described below. In FIGS. 31~44 used for describing the embodiment, dimensions of various components may not correspond to the dimensions in the drawings already described in the above embodiments, for the sake of technical understanding.

Figure 31:
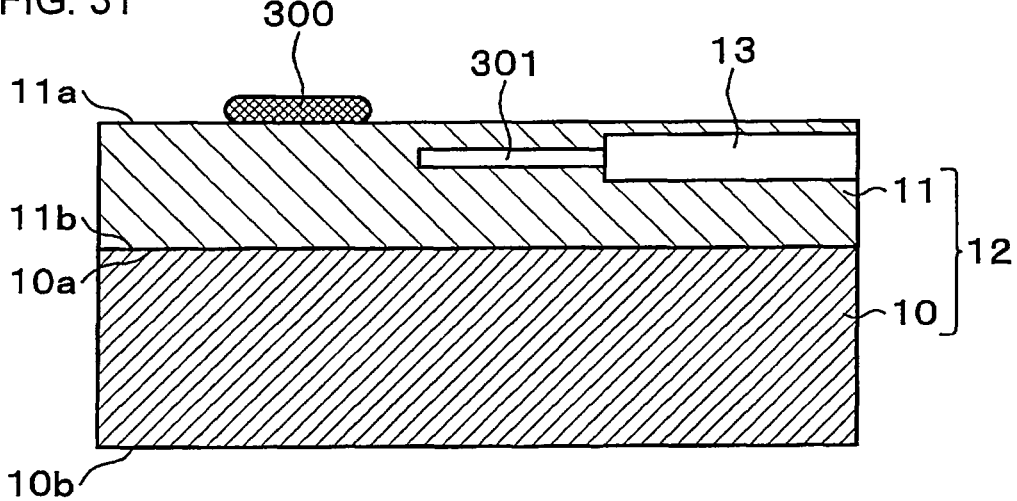
FIG. 31 is a cross-sectional view illustrating a state in which a device layer is formed on a wafer in yet another embodiment.

First, as illustrated in FIG. 31, a device layer 11 is formed on a surface (10a) of a wafer 10, and then bumps (not illustrated) to be used as lead electrodes are formed at a front surface (11a) of the device layer 11. Simultaneously, a front bump 300 serving as a device-side bump is formed. The front bump 300 short-circuits a through-hole electrode (310a) and an electrode (311b), as will be described later. The bump in this embodiment can be formed by a generally used semiconductor process, and therefore does not require a special step. The device layer 11 is provided with a shared wiring 301 connected to a circuit 13.

Figure 32:
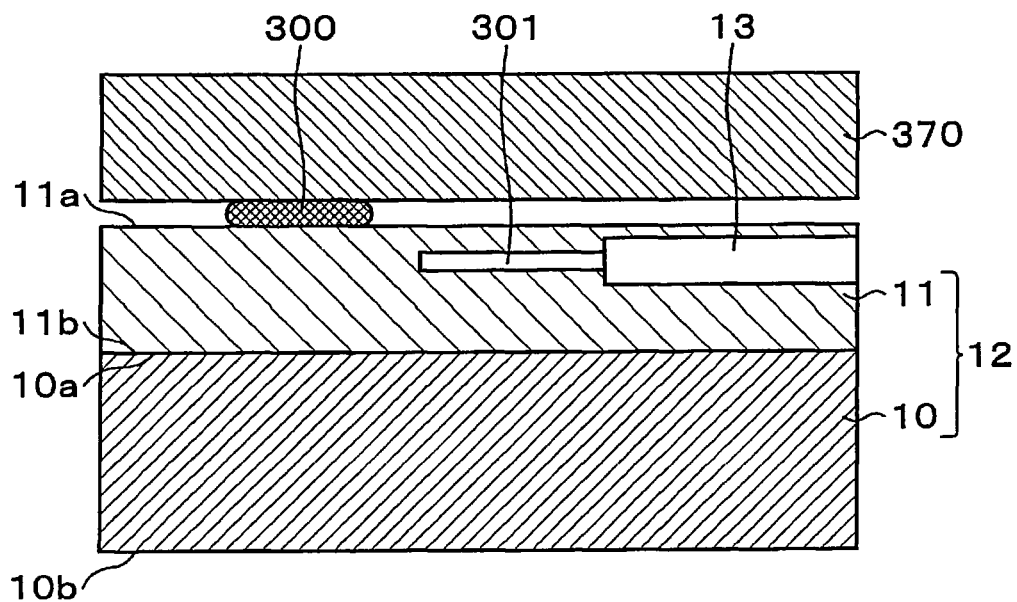
FIG. 32 is a cross-sectional view illustrating a state in which a support substrate is joined to a wafer in such an embodiment.
Figure 33:
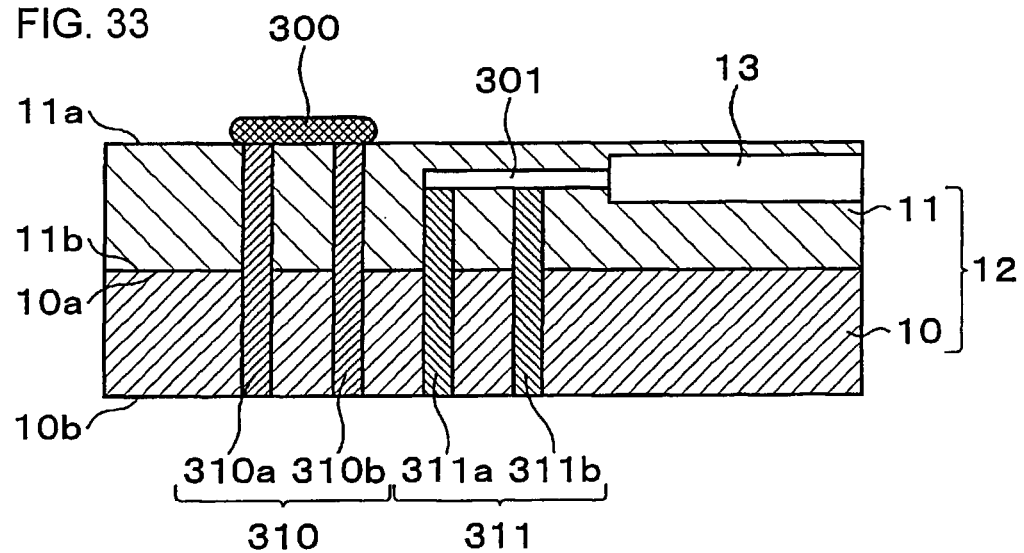
FIG. 33 is a cross-sectional view illustrating a state in which a through-hole electrode and an electrode are formed after thinning a wafer in such an embodiment.

As illustrated in FIG. 32, a support base plate 370 is joined, using adhesive, for instance, to the front surface (11a) of the device layer 11 provided with the front bump 300. The support base plate 370 is made of, for instance, a wafer or a glass base plate. Thereafter, as illustrated in FIG. 33, a back surface (10b) of the wafer 10 is polished to make the wafer 10 thinner. For the sake of illustration, FIG. 33 does not illustrate the support base plate 370 arranged on the device 11 side. Likewise, FIGS. 34–38 do not illustrate the support base plate 370.

As illustrated in FIG. 33, there are formed a pair of through-hole electrodes 310 that penetrate in the thickness direction through the wafer 10 and reach the back surface (10b) of the wafer 10 as well as a pair of vertical electrodes 311 that penetrate in the thickness direction through the wafer 10 (and a part of the device layer 11), and reach the back surface (10b) of the wafer 10. The paired through-hole electrodes 310 are connected to the front bump 300, and the paired electrodes 311 are connected to the shared wiring 301. For the sake of illustration, one of the paired through-hole electrodes 310, and particularly a through-hole electrode that is externally connected for transmitting a signal is referred to as the through-hole electrode (310a), and the other through-hole electrode is referred to as a through-hole electrode (310b). Also, one of the paired electrodes 311, and particularly an electrode connected to a back-surface wiring 350 to be described later is referred to as an electrode (311a), and the other electrode is referred to as an electrode (311b). The manner of forming the pairs of the through-hole electrodes 310 and the electrodes 311 is substantially the same as those of forming the through hole 20 for the electrode and the through-hole electrode 32 in the above embodiment, and therefore will not be described in detail. The shared wiring 301 and the electrodes 311 form the wirings in an embodiment according to the present invention. More specifically, the shared wiring 301 and the electrode 311 are connected to the circuit 13, are not connected to the through-hole electrode 310, and are at least partially exposed on the back surface (10b) of the wafer 10.

Figure 34:
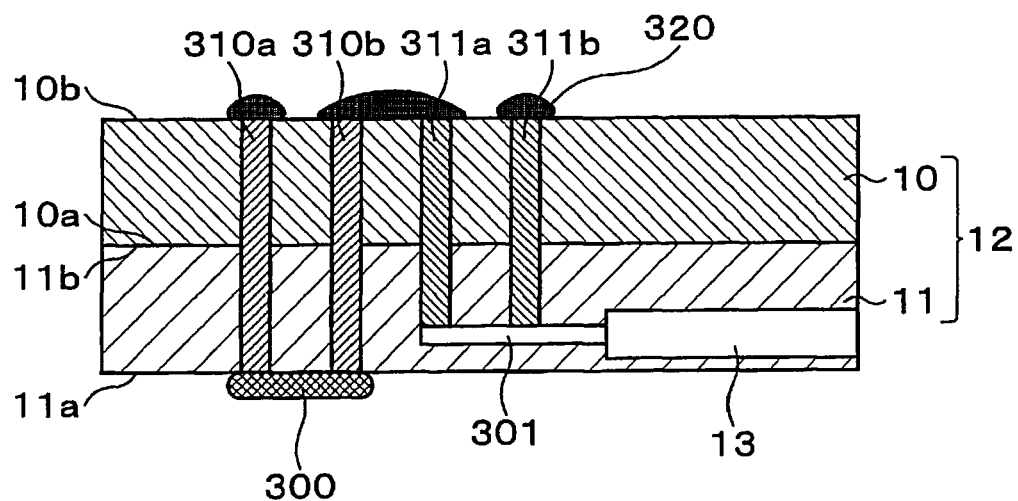
FIG. 34 is a cross-sectional view illustrating a state in which a plating solution is supplied onto a back surface of a wafer in such an embodiment.

Then, as illustrated in FIG. 34, the wafer 10 and the device layer 11 are inverted upside down, and a plating solution 320 is supplied onto the back surface (10b) of the wafer 10. In this operation, portions of the back surface (10b) of the wafer 10 such as portions around the through-hole electrode 310 and the electrode 311 where plating is to be formed as well as the portion where the back-surface wiring 350 is to be formed are made hydrophilic relative to the other portions. The portions where the back-surface wiring 350 may be formed is, for instance, a straight portion extending between the through-hole electrode (310b) and the electrode (311a). The plating solution 320 may be supplied onto the entire back surface (10b), but supplying the plating solution 320 on the hydrophilic portions relative to the rest allows efficient formation of the current path and accurate wiring in a later plating step. Such relative hydrophilization may be performed by actively hydrophilizing the portions to be plated, or by hydrophobizing other portions not to be plated. Alternatively, both hydrophilization and hydrophobization may be performed. In this manner, as illustrated in FIG. 34, the plating solution 320 is supplied onto portions around the through-hole electrode 310 and the electrode 311 on the back surface (10b) of the wafer 10.

Figure 35:
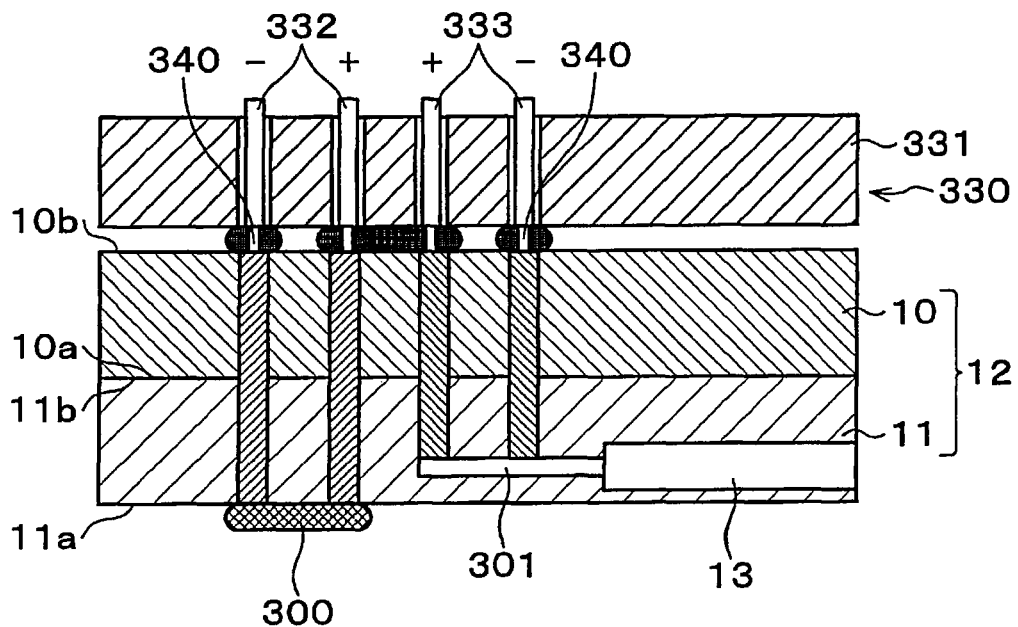
FIG. 35 is a cross-sectional view illustrating a state in which a template is arranged on a back-surface side of a wafer in such an embodiment.

As illustrated in FIG. 35, a template 330 is arranged on the back-surface (10b) side of the wafer 10. The template 330 has a base body 331 having a surface opposite the wafer 10, and multiple pairs of electrodes (332, 333) that are arranged at the surface of the base body 331 and serve as pairs of polarity-switchable opposing electrodes. The pairs of the electrodes (332, 333) are arranged in positions corresponding to the pair of the through-hole electrodes 310 and the pair of electrodes 311, respectively. Namely, the pair of the first electrodes 332 corresponds to the pair of the through-hole electrodes 310, and the pair of the second electrodes 333 corresponds to the pair of the electrodes 311.

Voltage is applied across the paired electrodes (332, 333), and voltage is applied across the paired through-hole electrodes 310 and the paired electrodes 311. Thereby, as illustrated in FIG. 35, a bridge 340 is formed between each of the electrodes (332, 333) and the corresponding through-hole electrode 310 or electrode 311. Each bridge 340 is formed by plating growing from the electrode on the negative side that is one of the electrodes in contact with the plating solution 320, and reaching the opposing electrode on the positive side. In this processing, when necessary, the polarities of the paired electrodes (332 or 333) in the template 330 may be switched to form efficiently the bridge 340. By further applying the voltage, a fitting phenomenon occurs to connect reliably the respective electrodes (332, 333) to the corresponding through-hole electrode 310 and electrode 311 through the bridges 340. In this state, voltage is applied to each pair of the through-hole electrodes (310 or 311) to perform electrical testing of the through-hole electrodes 310, the electrodes 311 and the circuit 13.

Figure 36:
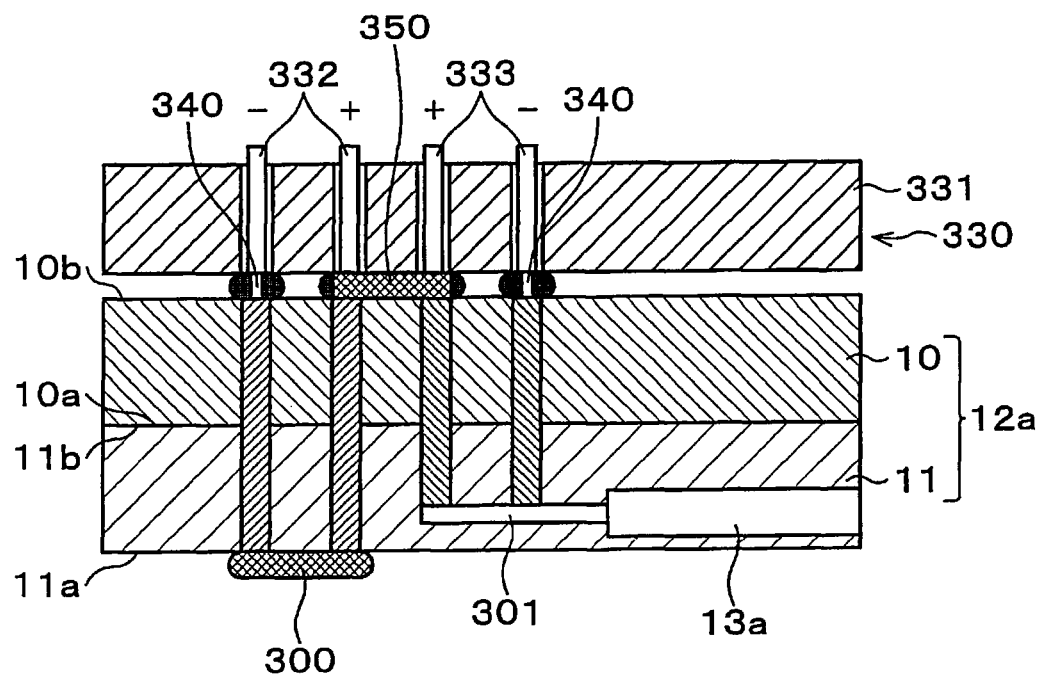
FIG. 36 is a cross-sectional view illustrating a state in which back-surface wiring connecting a through-hole electrode and an electrode is formed in such an embodiment.

As illustrated in FIG. 36, a back-surface wiring 350 serving as another wiring connecting the through-hole electrode (310b) and the electrode (311a) is formed for a good chip (12a) provided with a good circuit (13a) which is determined as a good circuit by electrical testing of the circuit 13. In this state, for applying the bias only to the through-hole electrode (310b) and the electrode (311a), the bias is applied only to the first and second electrodes (332, 333) corresponding to the through-hole electrode (310b) and the electrode (311a), respectively. Since the current path is formed between the first and second electrodes (332, 333) through the bridge 340, plating grows between them to form the back-surface wiring 350.

Figure 37:
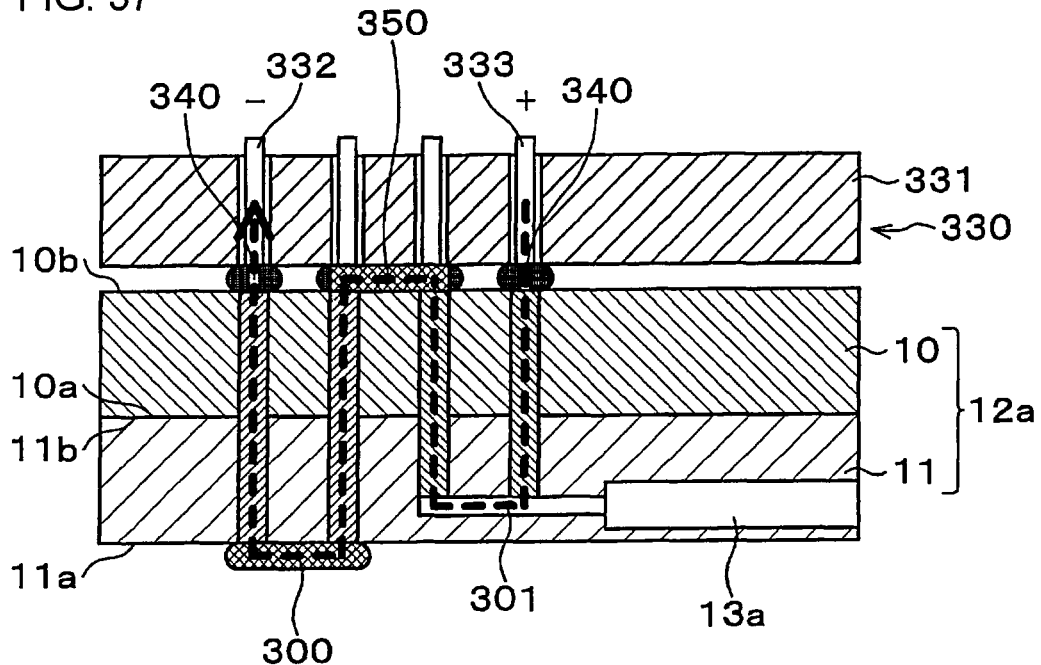
FIG. 37 is a cross-sectional view illustrating a state in which back-surface wiring connecting a through-hole electrode and an electrode is formed in yet another embodiment.

Alternatively, a method illustrated in FIG. 37 can likewise form the back-surface wiring 350 connecting the through-hole electrode (310b) and the electrode (311a). When a bias is applied only to the through-hole electrode (310a) and the electrode (311b), a current path indicated by an arrow in FIG. 37 is formed so that the back-surface wiring 350 is formed between the through-hole electrode (310b) and the electrode (311a). At this time, a bias is not applied to the electrodes opposed to the through-hole electrode (310b) and the electrode (311a), respectively.

Figure 38:
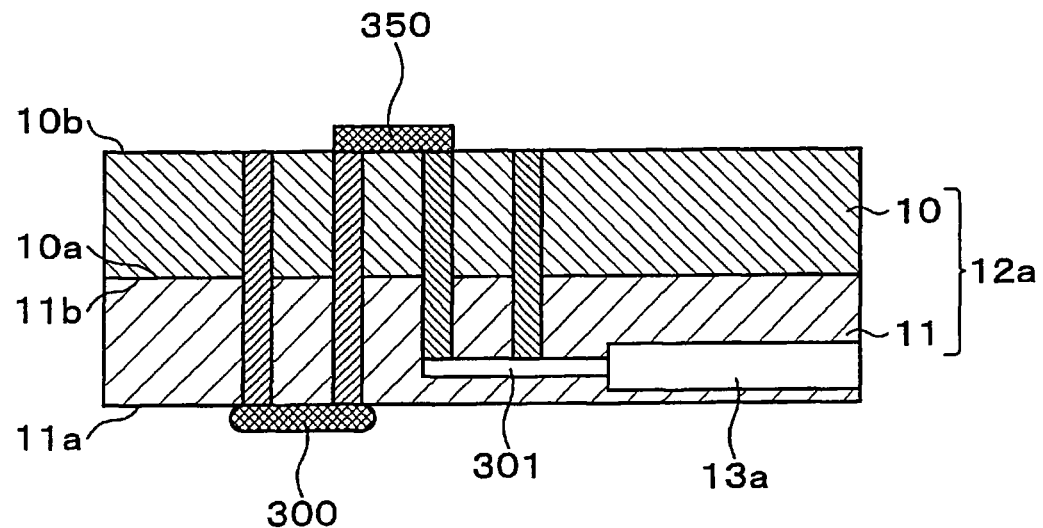
FIG. 38 is a cross-sectional view illustrating a state in which a template is withdrawn in such an embodiment.

As illustrated in FIG. 38, the template 330 is withdrawn. At this time, the bridge 340 between each of the electrodes (332, 333) and the corresponding one of the through-hole electrodes 310 and the electrodes 311 is removed. In this manner, the back-surface wiring 350 is formed, and the pair of through-hole electrodes 310, the pair of electrodes 311 and the circuit 13 are connected.

Figure 39:
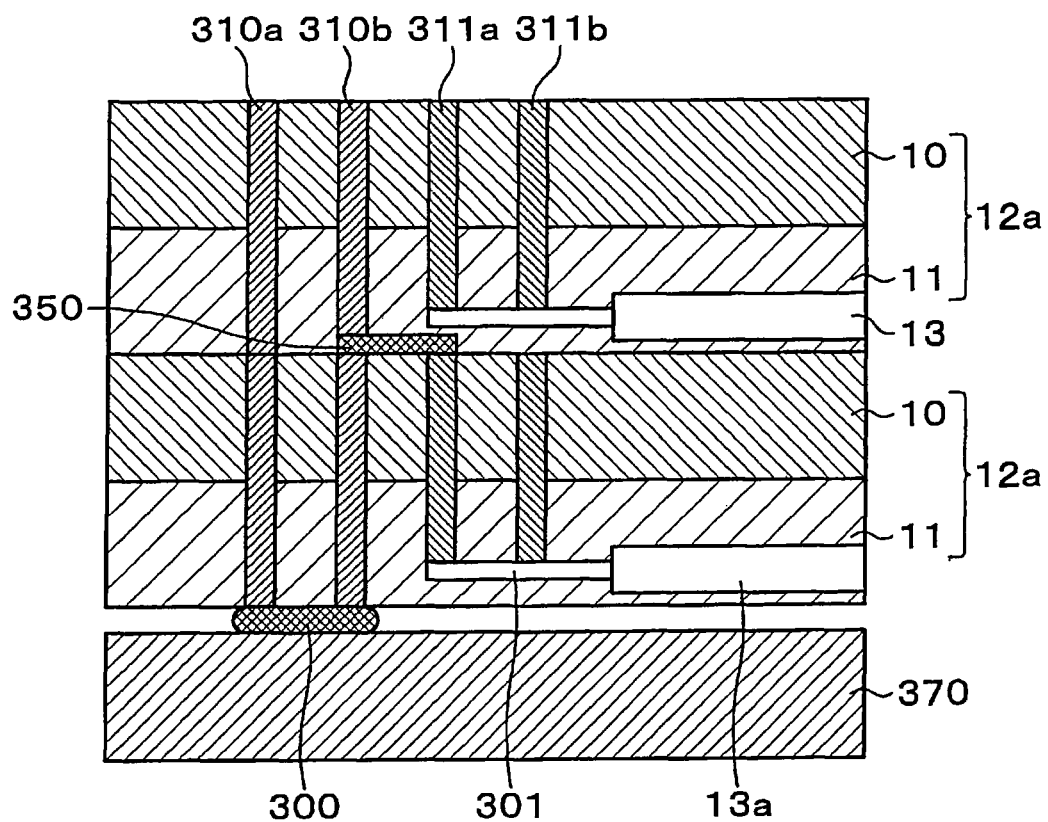
FIG. 39 is a cross-sectional view illustrating a state in which a second wafer is stacked on a first wafer in such an embodiment.

As illustrated in FIG. 39, on the wafer 10 (good chip 12a) provided with the back-surface wiring 350, a next wafer 10 is stacked (although FIG. 39 illustrates the chip as a good chip (12a), an inspection for determining a defective chip is performed in practice before the back-surface wiring 350 is formed on the second wafer as described later). For the sake of illustration, the former wafer 10 is referred to as the first wafer 10, and the latter wafer 10 is referred to as the second wafer 10. The second wafer 10 is stacked on the first wafer 10 in such a state that the device layer 11 is formed on its front surface (10a), i.e., in the state of the wafer 10 illustrated in FIG. 31. Thereafter, the back surface (10b) of the second wafer 10 is polished to thin it, and then the pair of through-hole electrodes 310 and the pair of electrodes 311 are formed on the second wafer 10. The through-hole electrode 310 of the second wafer 10 is electrically connected to the through-hole electrode 310 of the first wafer 10. The manner of forming the through-hole electrode 310 and the electrode 311 is substantially the same as those of forming the through hole 20 for the electrode and the through-hole electrode 32 in the foregoing embodiment, and therefore a detailed description is omitted here.

Figure 40:
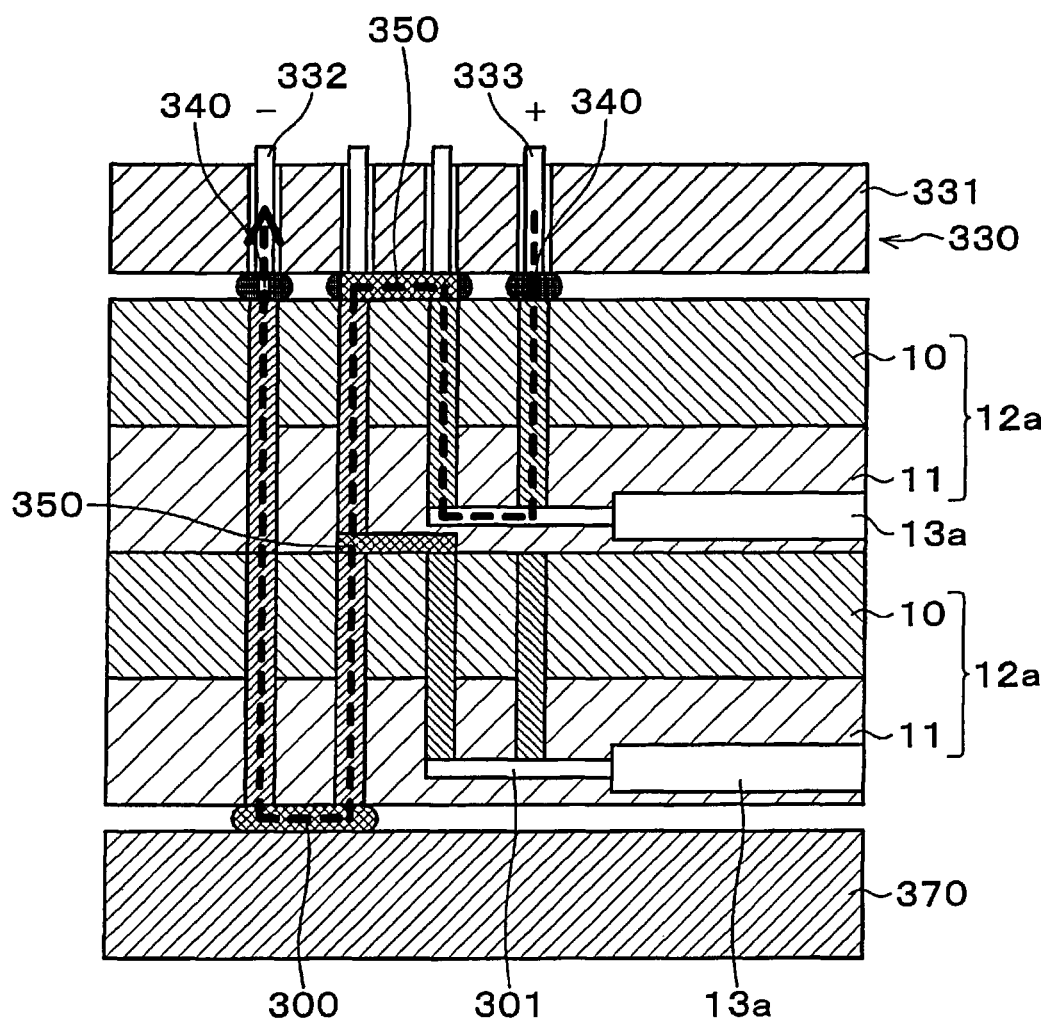
FIG. 40 is a cross-sectional view illustrating a state in which back-surface wiring connecting a through-hole electrode to an electrode in a second wafer is formed in such an embodiment.

As illustrated in FIG. 40, the template 330 is arranged on the back-surface (10b) side of the second wafer 10. In the same manner as that illustrated in FIG. 37, the back-surface wiring 350 connecting the through-hole electrode (310b) and the electrode (311a) is formed on the second wafer 10. More specifically, a bias is applied only to the through-hole electrode (310a) and the electrode (311b). Thereby, a current path indicated by the arrow in FIG. 40 is formed so that the back-surface wiring 350 is formed between the through-hole electrode (310b) and the electrode (311a). The back-surface wiring 350 may be formed in substantially the same manner as that illustrated in FIG. 36.

In a defective chip (12b) provided with a defective circuit (13b) that was determined to be defective by the electric characteristic test, the back-surface wiring 350 illustrated in FIG. 36 is not formed. Electrical testing is performed in substantially the same manner as that illustrated in FIGS. 35 and 36 when the template 330 is arranged on the back-surface (10b) side of the second wafer 10.

Figure 41:
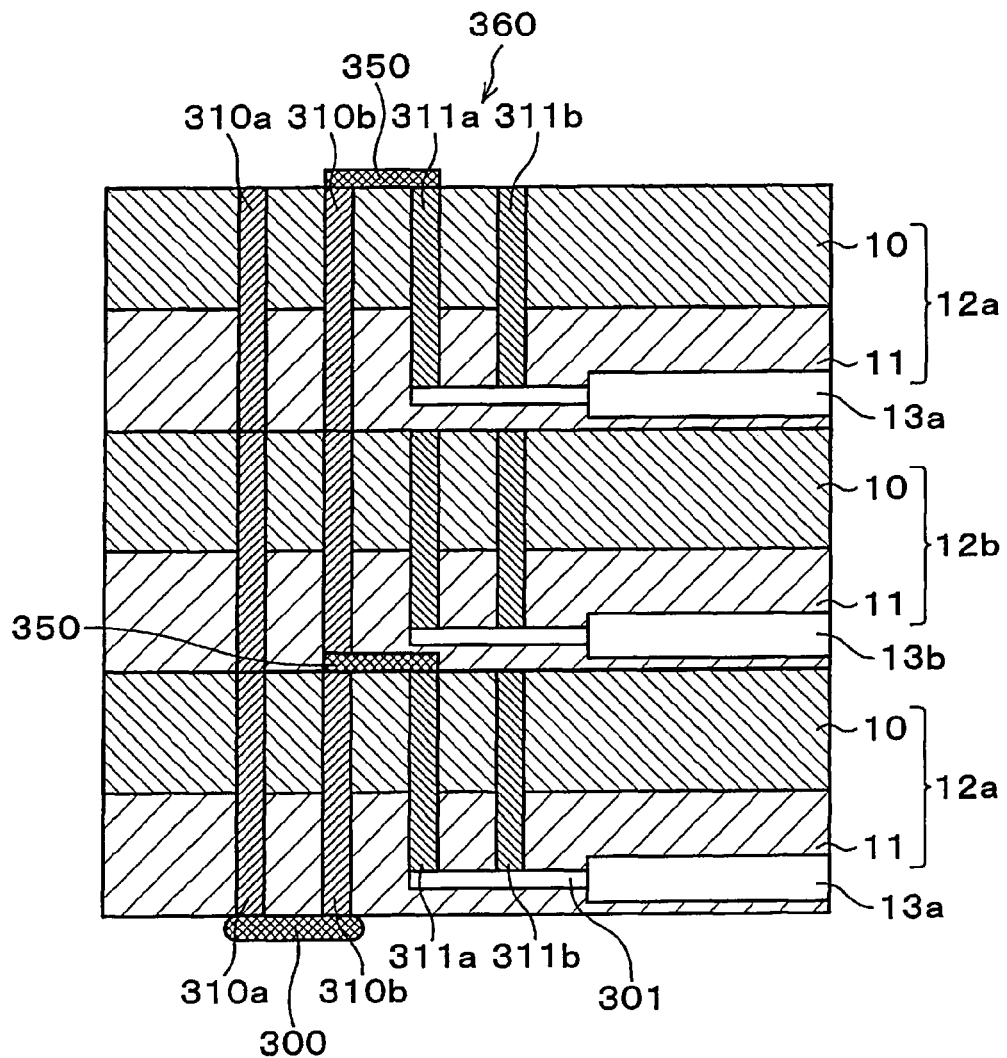
FIG. 41 is a view schematically illustrating a structure of a semiconductor device in such an embodiment.

As illustrated in FIG. 41, the good chips (12a) and the defective chip (12b) are stacked vertically. In this state, the multiple semiconductor chips 12 are stacked such that the through-hole electrodes 310 become conductive, namely, the through-hole electrodes 310 penetrate through the multiple semiconductor chips 12. Consequently, the semiconductor device 360 is manufactured to include the good chips (12a) and the defective chip(s) (12b) in a mixed fashion. The front bumps 300 of the semiconductor chips 12 except for the semiconductor chip 12 of the backmost layer may be eliminated. In the illustrated example, the three layers of the semiconductor chips 12 are stacked, but the number of the stacked semiconductor chips is not limited specifically. Further, the position of the defective chip (12b) in the semiconductor device 360 is not limited to that in the illustrated example. Regardless of the position of the layer containing the defective chip (12b), the semiconductor device 360 is formed to be a good device as described later.

In the semiconductor device 360 manufactured as described above, a predetermined data signal is transmitted to the through-hole electrode 310. The data signal includes, for example, addresses of the memory cells in the circuit 13 and data such as memory recorded in the memory cells. The through-hole electrode 310 and the good circuit (13a) are electrically connected so that the data signal from the through-hole electrode 310 is provided to the good circuit (13a). Since the through-hole electrode 310 is not electrically connected to the defective circuit (13b), the data signal from the through-hole electrode 310 is not provided to the defective circuit (13b). The semiconductor device 360 operates in this manner.

According to the embodiment described above, the back-surface wiring 350 connecting the through-hole electrode (310b) and the electrode (311a) can function as programmable wiring. Thus, by selectively forming the back-surface wiring 350 on the back surface (10b) of the wafer 10, the circuit 13 connected to the back-surface wiring 350 is selected. Therefore, the semiconductor chip 12 is appropriately selected. Since the good chips (12a) and defective chips (12b) are electrically isolated from each other as described above, the defective chip (12b) does not affect the good chip (12a). Therefore, even when a defective chip (12b) is present, the semiconductor device 360 is formed to be a good device, and the yield of the semiconductor devices 360 is improved.

All the stacked semiconductor chips 12 have completely the same structures except for the position of the back-surface wiring 350. Therefore, the semiconductor chips 12 are manufactured in volume by the same process, including the mask used for the patterning.

A method for selecting either connection or non-connection between the through-hole electrode 310 and the circuit 13 is simplified. Specifically, by switching the polarities of the paired electrodes (332, 333) of the template 330, the back-surface wiring 350 is appropriately and easily formed on the desired wafer 10. Since the selection method is simplified as described above, the semiconductor device 360 is manufactured efficiently.

At the back surface (10b) of the wafer 10, the portions where plating is to be formed are made hydrophilic relative to the other portions where the plating is not to be formed. Therefore, the current paths from the electrodes (332, 333) to the through-hole electrode 310 and the electrode 311 are formed efficiently. Thereby, the bridge 340 and the back-surface wiring 350 are formed appropriately.

The embodiment has been described by referring to a case where the back-surface wiring 350 appropriately selects the semiconductor chip 12. However, the semiconductor device 360 of this embodiment can be structured to perform another function. For example, it may be structured to select one semiconductor chip 12 from each of the stacked wafers 10, in which case the multiple stacked wafers 10 operate, as a whole, to record the program. For example, the address of the defective memory cell is recorded. In this case, for example, if the semiconductor device 360 has a redundant circuit that includes a redundant memory cell to be replaced with a defective memory cell, the defective memory cell is replaced based on the recorded address of the defective memory cell. This improves the yield of the semiconductor devices 360.

The embodiments have been described using a so-called back-via method in which the through-hole electrode 310 is formed from the back-surface (11b) of the wafer 10 not provided with the circuit 13. Since the through-hole electrode 310 is exposed on the back-surface (10b) side of the wafer 10 not provided with the circuit 13, the back-surface wiring 350 (programmable wiring) is also formed on the back-surface (10b) side of the wafer 10.

For the forming steps of the through-hole electrode, various methods have been proposed in addition to the back-via method.

Figure 42:
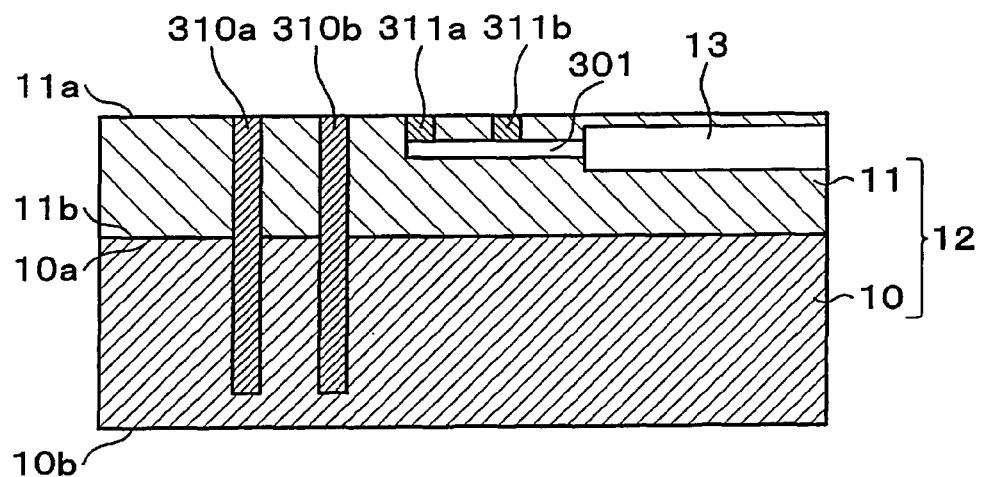
FIG. 42 is a cross-sectional view illustrating a state in which a through-hole electrode and an electrode are formed in a wafer in yet another embodiment.

For example, a so-called front-via method is employed in which the through-hole electrode is formed from the front surface (11a) provided with the circuit 13 (the formation of the through-hole electrode can be performed according to various kinds of timing such as before or after formation of the circuit 13). The present invention can also be applied to such cases. As illustrated in FIG. 42, a through hole is formed by etching the front surface (11a) bearing the circuit 13, and then is filled with an electrically conductive material to form the through-hole electrode 310 and the vertical electrode 311. In this stage, the through-hole electrode 310 has not penetrated through the wafer 10 and the device layer 11, but the back surface (10b) of the wafer 10 will be polished so that the through-hole electrode 310 penetrates through the wafer 10 and the device layer 11, as described later. The shared wiring 301 can be formed in advance in the step of forming the circuit 13, i.e., a so-called BEOL (Back End of Line).

In this embodiment, the through-hole electrode 310 and the electrode 311 are formed simultaneously. However, the electrode 311 may be formed in the step of forming the circuit 13, similar to forming the shared wiring 301. As is apparent from FIG. 42, since all the electrodes 311 and the shared wiring 301 are located in the device layer 11, they are formed in the step of forming the circuit 13.

Figure 43:
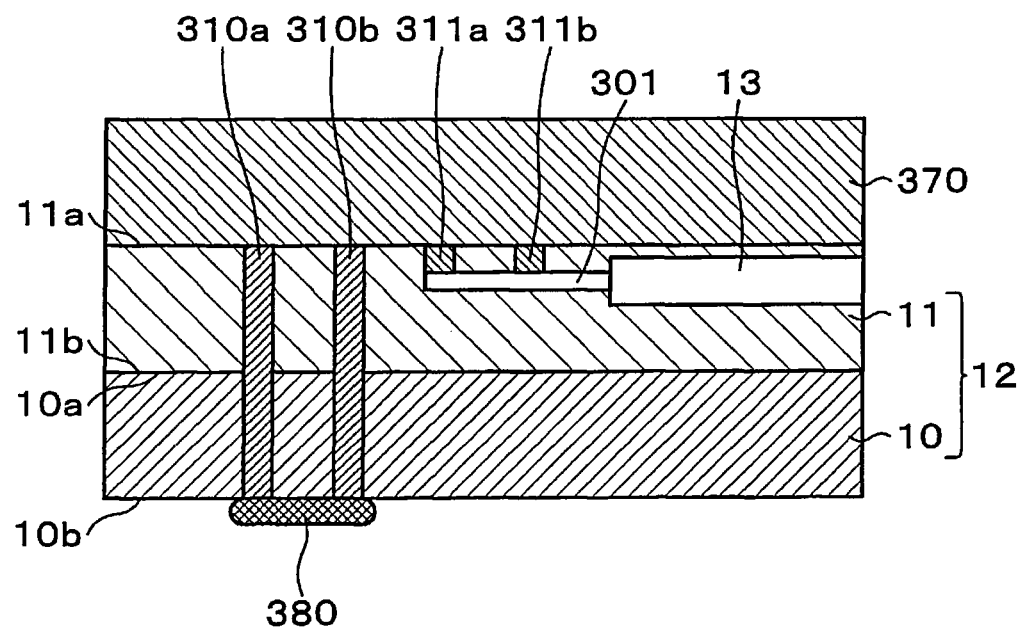
FIG. 43 is a cross-sectional view illustrating a state in which a support substrate is joined to a wafer in such an embodiment.

As illustrated in FIG. 43, in the state where the wafer 10 is joined to the support base plate 370, the back surface (10b) of the wafer 10 is polished to make the wafer 10 thinner so that a back bump 380 for connection between the through-hole electrodes (310a, 110b) is formed. In this case, unlike the above embodiments, the support base plate 370 is joined to the front surface (11a) that is a circuit formation surface of the wafer 10, but the rest of the steps are the same as those in the foregoing embodiments.

Figure 44:
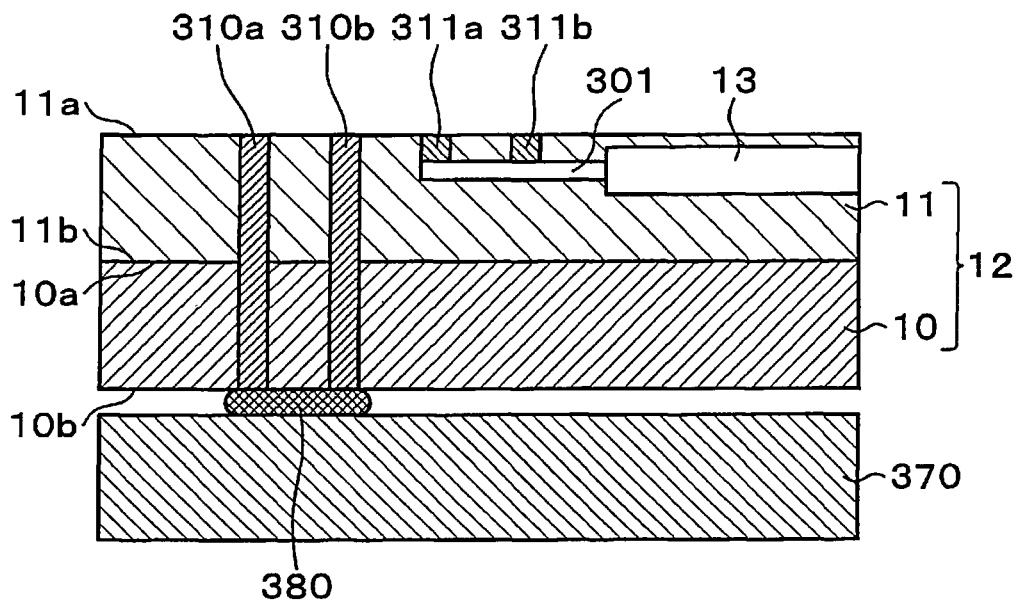
FIG. 44 is a cross-sectional view illustrating a state in which a position of a support plate with respect to a wafer is changed in such an embodiment.

As illustrated in FIG. 44, the position of the support base plate 370 changes to the back surface (10b) from the front surface (11a) of the wafer 10. In the state where the support base plate 370 is joined to the front surface (11a) of the wafer 10, another support base plate 370 is joined to the back surface (10b) of the wafer 10, and then the support base plate 370 that has been joined to the front surface (11a) is removed. Thereby, the support base plates 370 can be changed in position. In this state, since the through-hole electrode 310 and the electrode 311 are exposed on the front surface (11a) of the wafer 10 that is the circuit formation surface, the inspection using the template 330 and the formation of the back-surface wiring 350 (programmable wiring) are achieved, the same as in the above embodiments.

As described above, the present invention is not limited to the method of forming the through-hole electrodes and the like. According to an aspect of the invention, the short-circuited through-hole electrode pair and the vertical electrode pair are prepared, and the wiring is formed between them to achieve the function of programmable wiring.

In a three-dimensional integration technology using through-hole electrodes, when semiconductor chips are connected in series, the same control signal is provided to all the semiconductor chips to perform multiple selection or total selection of these semiconductor chips, thus prohibiting appropriate selection of semiconductor chips.

In one aspect of the present invention, a method for manufacturing a semiconductor device includes a first step of forming a pair of through-hole electrodes penetrating through a substrate in a thickness direction, and a pair of vertical electrodes extending in the thickness direction of the substrate and connected to one of the surfaces of the substrate, and in a device layer on the substrate, forming a shared wiring connecting the pair of vertical electrodes; a second step of forming connection wiring connecting one of the paired through-hole electrodes to one of the paired vertical electrodes; and a third step of stacking the substrates provided with the device layers to connect the through-hole electrode of one of the substrates to one of the paired through-hole electrodes of the other substrate opposite the one substrate and not connected to the connection wiring. In an embodiment according to the present invention, the substrates and the device layers form semiconductor chips.

In one aspect of the present invention, the connection wiring connecting the through-hole electrode to the vertical electrode can be structured to function as a programmable wiring. For example, in the first step, when multiple pairs of the through-hole electrodes and multiple pairs of the vertical electrodes are formed, and each shared wiring is connected to the circuit, the connection wiring is connected to only the specific through-hole electrode and the specific vertical electrode in the second step. In other words, the other through-hole electrodes are not electrically connected to the vertical electrodes. In this case, for example, when the substrates each provided with the device layer are stacked in the third step, and then the select signal is transmitted to the through-hole electrode connecting one and the other of the stacked substrates, only the circuit provided with the connection wiring is selected, and the circuit that is not electrically connected will not be selected. Therefore, the semiconductor chip is selected appropriately.

In another aspect of the present invention, in a semiconductor device provided with multiple stacked substrates, at least one of the stacked substrates includes a pair of through-hole electrodes penetrating through the substrate in a thickness direction, a pair of vertical electrodes extending in the thickness direction of the substrate and connected to one of surfaces of the substrate, a shared wiring connecting, in a device layer on the substrate, the pair of vertical electrodes, and a connection wiring connecting one of the paired through-hole electrodes to one of the paired vertical electrodes.

In yet another aspect of the present invention, a wiring forming jig for forming wiring on one of the surfaces of a substrate includes a base body having a surface opposite the substrate and multiple opposing electrodes located at the base body surface and arranged in positions opposed to electrodes exposed on the substrate surface. At least one of the opposing electrodes is polarity-switchable.

According to such an aspect of the present invention, in the semiconductor having a stack of multiple semiconductor chips, the back-surface wiring connecting the first and second through-hole electrodes can function as the programmable wiring so that semiconductor chips, for example, are appropriately selected.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a semiconductor device, comprising:

forming a structure comprising a substrate, a device layer formed on the substrate, a pair of through-hole electrodes penetrating through the substrate in a thickness direction of the substrate, a pair of vertical electrodes extending in the thickness direction of the substrate and reaching to one surface of the substrate, and a shared wiring connecting the pair of vertical electrodes in the device layer;

forming a connection wiring connecting one of the through-hole electrodes and one of the vertical electrodes on the one surface of the substrate; and stacking the structure and a second substrate such that an electrode of the second substrate is connected to a through-hole electrode which is not connected to the connection wiring among the pair of through-hole electrodes, wherein the forming of the structure comprises forming the pair of through-hole electrodes and the pair of vertical electrodes such that each of the through-hole electrodes and each of the vertical electrodes have end portions on the one surface of the substrate, respectively, and the forming of the connection wiring comprises forming the connection wiring connecting the end portions of the one of the through-hole electrodes and the one of the vertical electrodes on the one surface of the substrate.

2. The method for manufacturing a semiconductor device according to claim 1, wherein the forming of the structure comprises forming a second shared wiring connecting the pair of through-hole electrodes in the device layer and forming a device-side bump connected to the second shared wiring and connecting to a surface of the device layer, the stacking of the structure and the second substrate comprises laminating the structure and the second substrate such that the electrode of the second substrate is connected to the device-side bump, and the electrode of the second substrate is a through-hole electrode which is not connected to a connection wiring of the second substrate among a pair of through-hole electrodes penetrating through the second substrate.

3. The method for manufacturing a semiconductor device according to claim 2, wherein the forming of the connection wiring comprises positioning a template comprising a pair of first electrodes positioned to correspond to the pair of through-hole electrodes and configured to switch polarity and a pair of second electrodes positioned to correspond to the pair of vertical electrodes and configured to switch polarity, and applying voltage between one of the through-hole electrodes and one of the vertical electrodes through one of the first electrodes and one of the second electrodes, respectively, with different polarities such that the connection wiring comprising plating is formed between the one of the through-hole electrodes and the one of the vertical electrodes.

4. The method for manufacturing a semiconductor device according to claim 3, further comprising applying voltage between an auxiliary electrode and one of the first electrodes and the second electrodes with different polarities after the applying of voltage between one of the through-hole electrodes and one of the vertical electrodes, wherein the template has the auxiliary electrode positioned between the one of the through-hole electrodes and the one of the vertical electrodes.

5. The method for manufacturing a semiconductor device according to claim 3, further comprising hydrophilizing at least a region of a surface of the substrate prior to the forming of the connection wiring such that the region becomes more hydrophilic with respect to the other region of the surface and that the connection wiring comprising plating is formed in the region.

6. The method for manufacturing a semiconductor device according to claim 2, wherein the forming of the structure comprises forming the through-hole electrodes and the vertical electrodes such that the through-hole electrodes and the vertical electrodes include a through-hole electrode and a vertical electrode positioned adjacent to each other and having protruding portions facing each other, respectively.

7. The method for manufacturing a semiconductor device according to claim 1, wherein the forming of the structure comprises forming in the device layer a circuit connecting to the shared wiring.

8. The method for manufacturing a semiconductor device according to claim 1, wherein the forming of the connection wiring comprises positioning a template comprising a pair of first electrodes positioned to correspond to the pair of through-hole electrodes and configured to switch polarity and a pair of second electrodes positioned to correspond to the pair of vertical electrodes and configured to switch polarity, and applying voltage between one of the through-hole electrodes and one of the vertical electrodes through one of the first electrodes and one of the second electrodes, respectively, with different polarities such that the connection wiring comprising plating is formed between the one of the through-hole electrodes and the one of the vertical electrodes.

9. The method for manufacturing a semiconductor device according to claim 8, further comprising applying voltage between an auxiliary electrode and one of the first electrodes and the second electrodes with different polarities after the applying of voltage between one of the through-hole electrodes and one of the vertical electrodes, wherein the template has the auxiliary electrode positioned between the one of the through-hole electrodes and the one of the vertical electrodes.

10. The method for manufacturing a semiconductor device according to claim 8, further comprising hydrophilizing at least a region of a surface of the substrate prior to the forming of the connection wiring such that the region becomes more hydrophilic with respect to the other region of the surface and that the connection wiring comprising plating is formed in the region.

11. The method for manufacturing a semiconductor device according to claim 1, wherein the forming of the structure comprises forming the through-hole electrodes and the vertical electrodes such that the through-hole electrodes and the vertical electrodes include a through-hole electrode and a vertical electrode positioned adjacent to each other and having protruding portions facing each other, respectively.

* * * * *